(12) United States Patent
Huang et al.

(10) Patent No.: US 12,469,447 B2
(45) Date of Patent: Nov. 11, 2025

(54) PIXEL DRIVING CIRCUIT, DRIVING METHOD THEREOF, DISPLAY SUBSTRATE, AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Yao Huang, Beijing (CN); Li Zhu, Beijing (CN); Jia Liu, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/289,585

(22) PCT Filed: Feb. 24, 2023

(86) PCT No.: PCT/CN2023/078138
§ 371 (c)(1),
(2) Date: Nov. 6, 2023

(87) PCT Pub. No.: WO2024/174227
PCT Pub. Date: Aug. 29, 2024

(65) Prior Publication Data
US 2025/0104622 A1    Mar. 27, 2025

(51) Int. Cl.
*G09G 3/3233*     (2016.01)
(52) U.S. Cl.
CPC ... *G09G 3/3233* (2013.01); *G09G 2300/0426* (2013.01); *G09G 2300/0819* (2013.01);
(Continued)

(58) Field of Classification Search
CPC ......... G09G 3/3233; G09G 2300/0426; G09G 2300/0819; G09G 2300/0852; G09G 2300/0861; G09G 2310/08
See application file for complete search history.

(56) References Cited

U.S. PATENT DOCUMENTS

| | | |
|---|---|---|
| 2011/0090200 A1 | 4/2011 | Choi et al. |
| 2013/0162620 A1 | 6/2013 | Kim et al. |

(Continued)

FOREIGN PATENT DOCUMENTS

| | | |
|---|---|---|
| CN | 103680393 A | 3/2014 |
| CN | 106205491 A | 12/2016 |

(Continued)

OTHER PUBLICATIONS

USPTO, First Office Action, Aug. 15, 2025, corresponding U.S. Appl. No. 18/861,711.

*Primary Examiner* — Md Saiful A Siddiqui
(74) *Attorney, Agent, or Firm* — HOUTTEMAN LAW LLC

(57) ABSTRACT

A pixel driving circuit, including: a driving transistor, and first and second energy storage elements; a first reset sub-circuit configured to write an initialization voltage signal to a third node in response to a first reset signal; a second reset sub-circuit configured to, in response to a second reset signal, turn it conductive between a gate of the driving transistor and a fourth node and reset the two; a data writing sub-circuit configured to write a data voltage signal to the second energy storage element in response to a scanning signal; and a light emitting control sub-circuit configured to turn it conductive between a first electrode of the driving transistor and a power supply terminal in response to a first light emitting control signal, and transmit the data voltage (Continued)

signal to the gate of the driving transistor in response to a second light emitting control signal.

18 Claims, 18 Drawing Sheets

(52) U.S. Cl.
CPC ............... *G09G 2300/0852* (2013.01); *G09G 2300/0861* (2013.01); *G09G 2310/08* (2013.01)

(56) References Cited

U.S. PATENT DOCUMENTS

| | | |
|---|---|---|
| 2014/0326969 A1 | 11/2014 | Kim |
| 2015/0187878 A1 | 7/2015 | Yamazaki et al. |
| 2017/0186372 A1* | 6/2017 | Yanase ................. G09G 3/3233 |
| 2017/0249900 A1 | 8/2017 | Xiang et al. |
| 2018/0122301 A1 | 5/2018 | Yoon et al. |
| 2018/0145123 A1* | 5/2018 | Kim ..................... H10D 86/481 |
| 2019/0079331 A1 | 3/2019 | Miyamoto et al. |
| 2021/0150984 A1* | 5/2021 | Hwang ................ H10K 59/131 |
| 2021/0242255 A1 | 8/2021 | Wang et al. |
| 2021/0367021 A1 | 11/2021 | Yang et al. |
| 2022/0101777 A1* | 3/2022 | Kim ....................... G09G 3/3233 |
| 2022/0102463 A1* | 3/2022 | Park ................. H10K 59/80515 |
| 2022/0156477 A1* | 5/2022 | Lee ..................... H10K 59/1213 |
| 2022/0320256 A1* | 10/2022 | Yun ..................... H10K 59/1213 |
| 2022/0343842 A1* | 10/2022 | Yu ......................... G09G 3/3233 |
| 2023/0051015 A1* | 2/2023 | Im ........................ H10K 59/126 |
| 2024/0107812 A1* | 3/2024 | Kim ................... H10K 59/1216 |
| 2024/0212580 A1* | 6/2024 | Xu ............................ G09G 3/32 |

FOREIGN PATENT DOCUMENTS

| | | |
|---|---|---|
| CN | 106531085 A | 3/2017 |
| CN | 108665852 A | 10/2018 |
| CN | 111145693 A | 5/2020 |
| CN | 114530464 A | 5/2022 |
| CN | 114566115 A | 5/2022 |
| CN | 115410531 A | 11/2022 |
| DE | 112021001804 T5 | 1/2023 |
| WO | WO2022110179 A1 | 6/2022 |

* cited by examiner

In a reset phase, writing the initialization voltage signal to the third node through the first reset sub-circuit, turning it conductive between the gate of the driving transistor and the fourth node through the second reset sub-circuit, and resetting the gate of the driving transistor and the fourth node, where the first reset signal and the second reset signal are each in an operating level state — S1

In a threshold compensation phase, turning it conductive between the gate of the driving transistor and the fourth node through the second reset sub-circuit, to write a threshold voltage of the driving transistor to the first energy storage element, where the first light emitting control signal and the second reset signal are each in the operating level state — S2

In a data writing phase, writing the data voltage signal into the second energy storage element through the data writing sub-circuit, and resetting the fourth node through the second reset sub-circuit, where the second reset signal and the scanning signal are each in the operating level state — S3

In a light emitting phase, turning it conductive between the first electrode of the driving transistor and the power supply terminal and transmitting the data voltage signal to the gate of the driving transistor, through the light emitting control sub-circuit, so that the driving transistor provides a driving current for a light emitting device, where the first light emitting control signal and the second light emitting control signal are each in the operating level state — S4

FIG. 7

PIXEL DRIVING CIRCUIT, DRIVING METHOD THEREOF, DISPLAY SUBSTRATE, AND DISPLAY APPARATUS

TECHNICAL FIELD

The present disclosure relates to the field of display technology, and in particular, to a pixel driving circuit, a driving method thereof, a display substrate, and a display apparatus.

BACKGROUND

An application of an Active Matrix Organic Light Emitting Diode (AMOLED) panel is more and more wide. A display device in a pixel of the AMOLED panel is an Organic Light Emitting Diode (OLED). The AMOLED panel can emit light by driving a thin film transistor to generate a driving current in a saturation state, and the driving current drives the light emitting device to emit light.

SUMMARY

The present disclosure provide a pixel driving circuit, a driving method thereof, a display substrate, and a display apparatus.

In a first aspect, an embodiment of the present disclosure provides a pixel driving circuit including a driving transistor, a first reset sub-circuit, a second reset sub-circuit, a light emitting control sub-circuit, a data writing circuit, a first energy storage element, and a second energy storage element, where the first reset sub-circuit is configured to write an initialization voltage signal to a third node in response to a first reset signal, where the third node is a connection node between a second electrode of the driving transistor and a first end of the first energy storage element;

the second reset sub-circuit is configured to, in response to a second reset signal, turn it conductive between a gate of the driving transistor and a fourth node and reset the gate of the driving transistor and the fourth node, where the fourth node is a connection node among the first energy storage element, the second energy storage element and the second reset sub-circuit;

the data writing sub-circuit is configured to write a data voltage signal to the second energy storage element in response to a scanning signal; and the light emitting control sub-circuit is configured to turn it conductive between a first electrode of the driving transistor and a power supply terminal in response to a first light emitting control signal, and transmit the data voltage signal to the gate of the driving transistor in response to a second light emitting control signal.

In some embodiments, the first reset sub-circuit includes first reset transistor, where a gate of the first reset transistor is connected to a first reset signal line, a first electrode of the first reset transistor is connected to an initialization signal line, and a second electrode of the first reset transistor is connected to the third node.

In some embodiments, the initialization signal line extends in a first direction, an orthogonal projection of the initialization signal line on a base substrate is on a side of an orthogonal projection of the first reset signal line on the base substrate in a second direction, and the first direction intersects with the second direction; and the initialization signal line is connected to the first electrode of the first reset transistor through a first via.

In some embodiments, the second reset sub-circuit includes a second reset transistor and a third reset transistor, where a gate of the second reset transistor is connected to a second reset signal line, a first electrode of the second reset transistor is connected to a reference voltage line, and a second electrode of the second reset transistor is connected to the fourth node; and a gate of the third reset transistor is connected to the second reset signal line, a first electrode of the third reset transistor is connected to the gate of the driving transistor, and a second electrode of the third reset transistor is connected to the fourth node.

In some embodiments, the second reset transistor and the third reset transistor are both double-gate transistors, a first gate of the second reset transistor and a third gate of the third reset transistor are of a one-piece structure, and a second gate of the second reset transistor and a second gate of the third reset transistor are of a one-piece structure; and the second reset signal line is connected to the first gate of the second reset transistor and the first gate of the third reset transistor through a second via, and is connected to the second gate of the second reset transistor and the second gate of the third reset transistor through a third via.

In some embodiments, the second reset sub-circuit includes a second reset transistor and a third reset transistor, where a gate of the second reset transistor is connected to a second reset signal line, a first electrode of the second reset transistor is connected to a reference voltage line, and a second electrode of the second reset transistor is connected to the gate of the driving transistor; and a gate of the third reset transistor is connected to the second reset signal line, a first electrode of the third reset transistor is connected to the gate of the driving transistor, and a second electrode of the third reset transistor is connected to the fourth node.

In some embodiments, where the light emitting control sub-circuit includes a first light emitting control transistor and a second light emitting control transistor, where a gate of the first light emitting control transistor is connected to a first light emitting control line, a first electrode of the first light emitting control transistor is connected to a first power supply line, and a second electrode of the first light emitting control transistor is connected to the first electrode of the driving transistor; and a gate of the second light emitting control transistor is connected to a second light emitting control line, a first electrode of the second light emitting control transistor is connected to the first electrode of the driving transistor, and a second electrode of the second light emitting control transistor is connected to the second energy storage element.

In some embodiments, the first power supply line includes a first power supply sub-line extending in a first direction and a second power supply sub-line extending in a second direction, where the first direction intersects with the second direction; and the first power supply sub-line is connected to the first electrode of the first light emitting control transistor through a fourth via, and the second power supply sub-line is connected to the first power supply sub-line through a fifth via.

In some embodiments, the second light emitting control transistor is a double-gate transistor, the second light emitting control line is connected to a first gate of the second light emitting control transistor through a sixth via and connected to a second gate of the second light emitting control transistor through a seventh via, and the second light emitting control line extends in the first direction.

In some embodiments, the pixel driving circuit further includes a first transfer electrode, where the first transfer electrode is connected to the first electrode of the second light emitting control transistor through an eighth via, and is connected to the gate of the driving transistor through a ninth via.

In some embodiments, the data writing sub-circuit includes a data writing transistor, where a gate of the data writing transistor is connected to a scanning signal line, a first electrode of the data writing transistor is connected to a data signal line, and a second electrode of the data writing transistor is connected to the second energy storage element and the light emitting control sub-circuit.

In some embodiments, the data signal line extends in a second direction, and the scanning signal line includes a scanning line body, a first connecting part, and a second connecting part, which are formed as a one-piece structure, where the scanning line body extends in a first direction, and the first connecting part and the second connecting part are on two opposite sides of the scanning line body, respectively, and are aligned in a second direction; where the first direction intersects with the second direction; and the data writing transistor is a double-gate transistor, the first connecting part is connected to a first gate of the data writing transistor through a tenth via, and the second connecting part is connected to a second gate of the data writing transistor through an eleventh via.

In some embodiments, the pixel driving circuit further includes a second transfer electrode, where the second transfer electrode is connected to the first electrode of the data writing transistor through a twelfth via, and the data signal line is connected to the second transfer electrode through a thirteenth via.

In some embodiments, the first energy storage element includes a first capacitor, where the first capacitor includes a first plate and a second plate, the first plate is connected to the second electrode of the driving transistor, and the second plate is connected to the second energy storage element.

In some embodiments, the first plate is on a side of the second plate away from a base substrate, the driving transistor is a double-gate transistor, a second gate of the driving transistor is on a side of a first gate of the driving transistor away from the base substrate, and the first gate of the driving transistor is shared with the first plate.

In some embodiments, the pixel driving circuit further includes a third transfer electrode, where one end of the third transfer electrode is connected to the first gate of the driving transistor through a fourteenth via, and the other end of the third transfer electrode is connected to the second electrode of the driving transistor through a fifteenth via.

In some embodiments, the second reset sub-circuit includes a second reset transistor and a third reset transistor; the first plate is on a side of the second plate away from a base substrate, the pixel driving circuit further includes a fourth transfer electrode, one end of the fourth transfer electrode is connected to the second plate through a sixteenth via, and the other end of the fourth transfer electrode is connected to a second electrode of the third reset transistor through a seventeenth via.

In some embodiments, the second energy storage element includes a second capacitor, where the second capacitor includes a third plate and a fourth plate, the third plate is connected to the first energy storage element, and the fourth plate is connected to the data writing sub-circuit.

In some embodiments, the data writing sub-circuit includes a data writing transistor; and
the pixel driving circuit further includes a fifth transfer electrode, where one end of the fifth transfer electrode is connected to a second electrode of the data writing transistor through an eighteenth via, and the other end of the fifth transfer electrode is connected to the fourth plate through a nineteenth via.

In some embodiments, the first energy storage element includes a first capacitor, where the first capacitor includes a first plate and a second plate, and the third plate of the second capacitor and the second plate are connected into a one-piece structure.

In some embodiments, the pixel driving circuit includes a first gate metal layer, a semiconductor layer, and a second gate metal layer, which are sequentially arranged in a direction away from a base substrate,
where respective transistors in the pixel driving circuit are all double-gate transistors, and the semiconductor layer includes active layers, first electrodes and second electrodes of the respective transistors in the pixel driving circuit; the first gate metal layer includes first gates of the respective transistors in the pixel driving circuit, and the second gate metal layer includes second gates of the respective transistors in the pixel driving circuit.

In some embodiments, the light emitting control sub-circuit includes a first light emitting control transistor and a second light emitting control transistor; and
the pixel driving circuit further includes a first source/drain metal layer on a side of the second gate metal layer away from the base substrate, where the first source/drain metal layer includes a first transfer electrode, where the first transfer electrode is connected to the first electrode of the second light emitting control transistor through an eighth via, and is connected to the gate of the driving transistor through a ninth via.

In some embodiments, the first electrode of the first light emitting control transistor is connected to a first power supply line, where the first power supply line includes a first power supply sub-line and a second power supply sub-line, the first power supply sub-line is in the first source/drain metal layer, the second power supply sub-line is in a second source/drain metal layer, and the second source/drain metal layer is on a side of the first source/drain metal layer away from the base substrate; and
the first power supply sub-line is connected to the first electrode of the first light emitting control transistor through a fourth via, and the second power supply sub-line is connected to the first power supply sub-line through a fifth via.

In some embodiments, the first reset sub-circuit includes a first reset transistor; the second reset sub-circuit includes a second reset transistor and a third reset transistor; the data writing sub-circuit includes a data writing transistor;
orthographic projections of the active layer of the second reset transistor, the active layer of the third reset transistor, the active layer of the second light emitting control transistor, and the active layer of the data writing transistor on the base substrate each overlap an orthographic projection of the second power supply sub-line on the base substrate; and orthographic projections of the active layer of the first reset transistor, the active layer of the first light emitting control transistor, and the active layer of the driving transistor on the base substrate overlaps an orthographic projection of a second power supply line on the base substrate.

In some embodiments, the second reset sub-circuit includes a second reset transistor and a third reset transistor; and the pixel driving circuit further includes a first source/drain metal layer on a side of the second gate metal layer away from the base substrate, the first source/drain metal layer includes a reference voltage line, and the reference voltage line is connected to the first electrode of the second reset transistor through a twentieth via.

In some embodiments, the data writing sub-circuit includes a data writing transistor;

the pixel driving circuit further includes a first source/drain metal layer and a second source/drain metal layer, the first source/drain metal layer is on a side of the second gate metal layer away from the base substrate, and the second source/drain metal layer is on a side of the first source/drain metal layer away from the base substrate;

the first source/drain metal layer includes a scanning signal lines and a second transfer electrode; the second source/drain metal layer includes a data signal line; the scanning signal line is connected to the first gate of the data writing transistor through a tenth via, and is connected to the second gate of the data writing transistor through an eleventh via; and the second transfer electrode is connected to the first electrode of the data writing transistor through a twelfth via, and the data signal line is connected to the second transfer electrode through a thirteenth via.

In some embodiments, the pixel driving circuit further includes a light shielding metal layer between the first gate metal layer and the base substrate; and the first energy storage element includes a first capacitor, and the first capacitor includes a first plate and a second plate; the second energy storage element includes a second capacitor, and the second capacitor includes a third plate and a fourth plate; the light shielding metal layer includes the second plate and the third plate; and the first gate metal layer further includes the first plate and the fourth plate.

In some embodiments, the pixel driving circuit further includes a first source/drain metal layer on a side of the second gate metal layer away from the base substrate; and the first source/drain metal layer includes a third transfer electrode, where one end of the third transfer electrode is connected to the first gate of the driving transistor through a fourteenth via, and the other end of the third transfer electrode is connected to the second electrode of the driving transistor through a fifteenth via.

In some embodiments, the second reset sub-circuit includes a second reset transistor and a third reset transistor; and the first source/drain metal layer further includes a fourth transfer electrode, where one end of the fourth transfer electrode is connected to the second plate through a sixteenth via, and the other end of the fourth transfer electrode is connected to the second electrode of the third reset transistor through a seventeenth via.

In some embodiments, the pixel driving circuit further includes a first source/drain metal layer on a side of the second gate metal layer away from the base substrate; and the data writing sub-circuit includes a data writing transistor; the first source/drain metal layer includes a fifth transfer electrode, where one end of the fifth transfer electrode is connected to the second electrode of the data writing transistor through an eighteenth via, and the other end of the fifth transfer electrode is connected to the fourth plate through a nineteenth via.

In a second aspect, the present disclosure further provides a method of driving the pixel driving circuit, including:

in a reset phase, writing the initialization voltage signal to the third node through the first reset sub-circuit, turning it conductive between the gate of the driving transistor and the fourth node through the second reset sub-circuit, and resetting the gate of the driving transistor and the fourth node, where the first reset signal and the second reset signal are each in an operating level state;

in a threshold compensation phase, turning it conductive between the gate of the driving transistor and the fourth node through the second reset sub-circuit, to write a threshold voltage of the driving transistor to the first energy storage element, where the first light emitting control signal and the second reset signal are each in the operating level state;

in a data writing phase, writing the data voltage signal into the second energy storage element through the data writing sub-circuit, and resetting the fourth node through the second reset sub-circuit, where the second reset signal and the scanning signal are each in the operating level state; and in a light emitting phase, turning it conductive between the first electrode of the driving transistor and the power supply terminal and transmitting the data voltage signal to the gate of the driving transistor, through the light emitting control sub-circuit, so that the driving transistor provides a driving current for a light emitting device, where the first light emitting control signal and the second light emitting control signal are each in the operating level state.

In a third aspect, the present disclosure further provides a display substrate, including a display region, where the display region includes a plurality of pixel regions, and each of the plurality of pixel regions is provided with the pixel driving circuit described above and a light emitting device electrically connected to the pixel driving circuit.

In a fourth aspect, the present disclosure further provides a display apparatus including the display substrate described above.

BRIEF DESCRIPTION OF DRAWINGS

The accompanying drawings, which are included to provide a further understanding of the present disclosure and constitute a part of this specification, serve to explain the present disclosure together with the following detailed description, but do not constitute a limitation of the present disclosure. In the drawings:

FIG. 7 is a schematic diagram illustrating a driving method of a pixel driving circuit provided in some embodiments of the present disclosure.

DETAIL DESCRIPTION OF EMBODIMENTS

Figure 1:
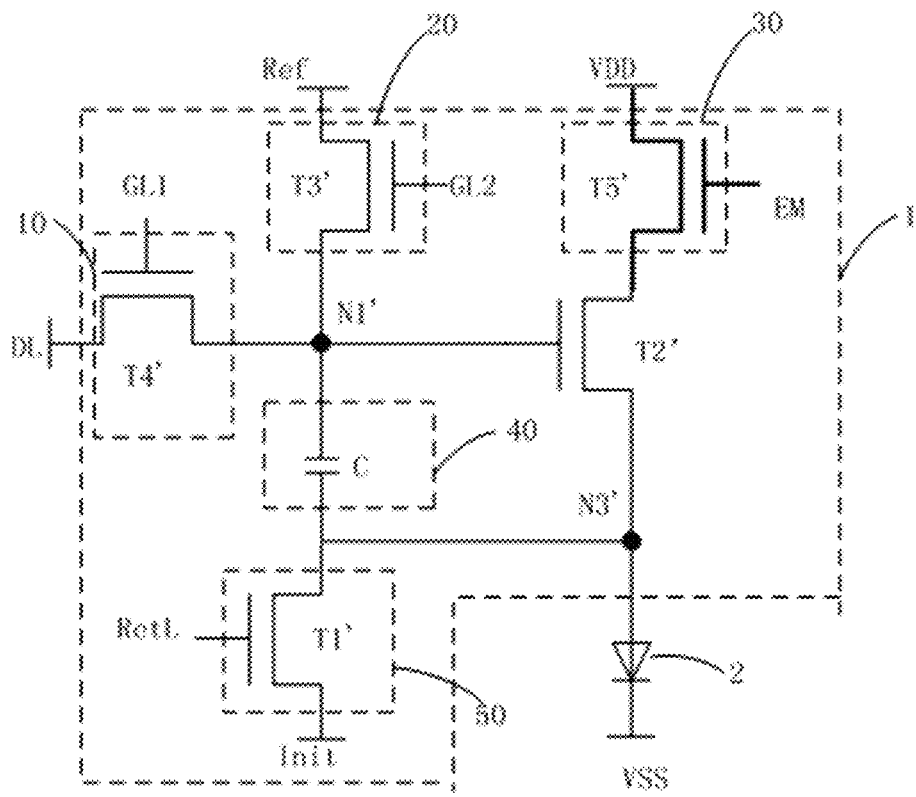
FIG. 1 is a schematic diagram illustrating a pixel driving circuit and a light emitting device provided in some embodiments.

The embodiments of the present disclosure will be described in detail below with reference to the accompanying drawings. It should be understood that the embodiments described herein are only intended to illustrate and explain the present disclosure, but not to limit the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are some, but not all, embodiments of the present disclosure. All other embodiments, which can be derived by one of ordinary skill in the art from the described embodiments of the present disclosure without creative efforts, are within the protection scope of the present disclosure.

Unless defined otherwise, technical or scientific terms used in the embodiment of the present disclosure shall have the ordinary meaning as understood by one of ordinary skill in the art to which the present disclosure belongs. The use of "first", "second", and the like in the present disclosure is not intended to indicate any order, quantity, or importance, but rather serves to distinguish one element from another. Also, the word "comprising", "comprises", or the like means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

It should be noted that the layer in the embodiment of the present disclosure is illustrated schematically, which does not represent an actual thickness of the layer.

In addition, the transistor involved in the embodiment of the present disclosure may be one independently selected from a polycrystalline silicon thin film transistor, an amorphous silicon thin film transistor, an oxide thin film transistor, and an organic thin film transistor. Reference in the present disclosure to a "first electrode" specifically refers to a source of a transistor, and a corresponding "second electrode" specifically refers to a drain of the transistor. Of course, one of ordinary skill in the art will recognize that the "first electrode" and the "second electrode" are interchangeable.

An operating level state is a level state in which it turns conductive between the first and second electrodes of the transistor, and a non-operating level state is a level state in which it is electrically cut off between the first and second electrodes of the transistor. The transistors may be divided into N-type transistors and P-type transistors, and each transistor in the present disclosure may be independently selected from the N-type transistors or the P-type transistors. For an N-type transistor, the operating level state is a high level state, and the non-operating level state is a low level state. For a P-type transistor, the operating level state is a low level state and the non-operating level state is a high level state. In the following embodiments, all transistors in a pixel unit are N-type transistors, and in this case, the transistors in the pixel driving circuit may be simultaneously manufactured through the same manufacturing process.

The display substrate includes a display region and a peripheral region on the periphery of the display region. The display region includes a plurality of pixel regions, and each pixel region is provided with a light emitting device and a pixel driving circuit for providing a driving signal for the light emitting device.

FIG. 1 is a schematic diagram illustrating a pixel driving circuit and a light emitting device provided in some embodiments. As shown in FIG. 1, the pixel driving circuit 1 includes a driving transistor T2', a threshold compensation sub-circuit 20, a data writing sub-circuit 10, a reset sub-circuit 50, a light emitting control sub-circuit 30, and an energy storage element 40.

The data writing sub-circuit 10, the threshold compensation sub-circuit 20, a gate of the driving transistor T2', and the energy storage element 40 are connected to a node N1'. A second electrode of the driving transistor T2', the reset sub-circuit 50, and the energy storage element 40 are connected to a node N3'. The reset sub-circuit 50 is configured to write an initialization voltage signal to the node N3' in response to a reset signal. The data writing sub-circuit 10 is configured to write a data voltage signal to the first node in response to a first scanning signal. The threshold compensation sub-circuit 20 is configured to write a reference voltage signal to the first node in response to a second scanning signal. The light emitting control sub-circuit 30 is configured to turn it conductive between the first power supply line VDD and a first electrode of the driving transistor T2' in response to a light emitting control signal.

In one example, the data writing sub-circuit 10 includes a data writing transistor T4' having a gate connected to a first scanning signal line GL1, a first electrode connected to a data signal line DL, and a second electrode connected to the node N1'. The reset sub-circuit 50 includes a reset transistor T1' having a gate connected to a reset signal line RstL, a first electrode connected to an initialization signal line Init, and a second electrode connected to the node N3'. The threshold compensation sub-circuit 20 includes a threshold compensation transistor T3' having a gate connected to a second scanning line GL2, a first electrode connected to a reference signal line Ref, and a second electrode connected to the node N1'. The light emitting control sub-circuit 30 includes a light emitting control transistor T5' having a gate connected to a light emitting control line EM, a first electrode connected to a first power supply line VDD, and a second electrode connected to the first electrode of the driving transistor T2'. The second electrode of the driving transistor T2' is connected to a first electrode of a light emitting device 2, and a second electrode of the light emitting device 2 is connected to a second power supply line VSS. The energy storage element 40 includes a capacitor C having two ends connected to the node N1' and the node N3', respectively.

Figure 2:
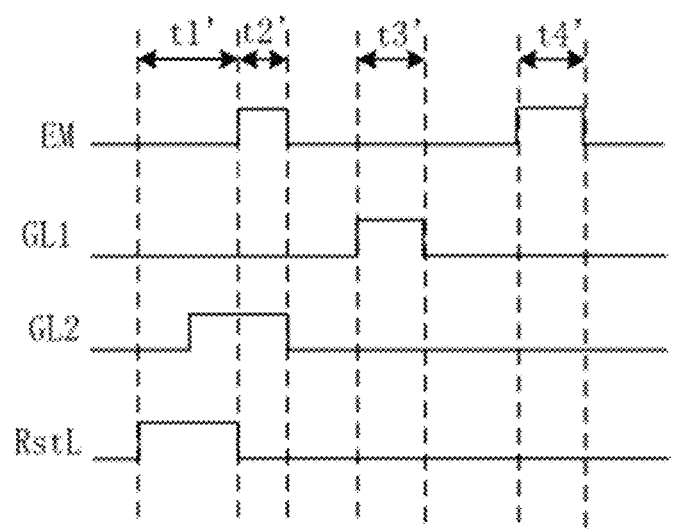
FIG. 2 is a diagram illustrating a timing of the pixel driving circuit in FIG. 1.

FIG. 2 is a diagram illustrating a timing of the pixel driving circuit in FIG. 1. As shown in FIG. 2, in a reset phase t1', the reset signal provided by the reset signal line is in the operating level state, and at this time, the reset transistor T1' is turned on, and the initialization voltage signal provided by the initialization signal line Init is transmitted to the node N3'. Then, the scanning signal provided by the second scanning signal line GL2 is in the operating level state, so that the threshold compensation transistor T3' is controlled to be turned on, and the reference voltage signal provided by the reference signal line Ref is transmitted to the node N1'. In the reset phase t1', reset of the node N1' and the node N3' is accomplished.

In a threshold compensation phase t2', the light emitting control signal provided by the light emitting control line Em is in the operating level state, and at this time, the light emitting control transistor T5' is turned on so that it turns conductive between the first power supply line and the first electrode of the driving transistor T2'. Moreover, the second scanning signal provided by the second scanning signal line GL2 is in the operating level state, so that the reset transistor T3' is turned on, and the reset signal provided by the reset signal line Ref is transmitted to the node N1'. Since a gate-source voltage of the driving transistor T2' is greater than a threshold voltage, the driving transistor T2' is turned on. The node N3' is continuously charged till the driving transistor T2' is turned off, in which time a potential at the node N3' is Vref−Vth. Vref is a voltage of the reference voltage signal, and Vth is the threshold voltage of the driving transistor T2'.

In a data writing phase t3', the first scanning signal provided by the first scanning signal line GL1 is in the operating level state, the data writing transistor T4' is turned on, and the data signal on the data signal line DL is transmitted to the node N1'. A potential at the node N1' is denoted as Vdata.

In a light emitting phase t4', the light emitting control signal provided by the light emitting control line EM is in the operating level state, and at this time, the light emitting control transistor T5' is turned on, and the potential at the node N3' is abruptly changed to Vdd. Due to a bootstrap action of the capacitor C, the potential at the node N1' changes to Vdata+Vdd−Vref+Vth. The light emitting device emits light under the driving of the driving transistor T2', and at this time, the driving transistor T2' operates in a saturation region, and the gate-source voltage Vgs of the driving transistor T2' is (Vdata+Vdd−Vref+Vth)−Vdd=Vdata−Vref+Vth.

An expression of the driving current of the driving transistor T2' is as follows:

$$IOLED = \beta(Vgs - Vth)^2 = (Vdata - Vref + Vth - Vth)^2 = (Vdata - Vref)^2$$

$$\beta = \frac{1}{2}\mu_n C_{ox}\left(\frac{W}{L}\right),$$

$\mu_n$ is electron mobility of the driving transistor T2', $C_{ox}$ is an insulation capacitance per unit area, and W/L is a width-to-length ratio of the driving transistor T2'.

However, in the data writing phase, since the node N3' is floating in the pixel driving circuit described above, when the data voltage signal is written to the node N1', the potential at the node N3' is changed by the bootstrap action of the capacitor C. Furthermore, the potential at the node N3' varies for different data voltages, so that the display effect of the whole screen is poor.

Figure 3:
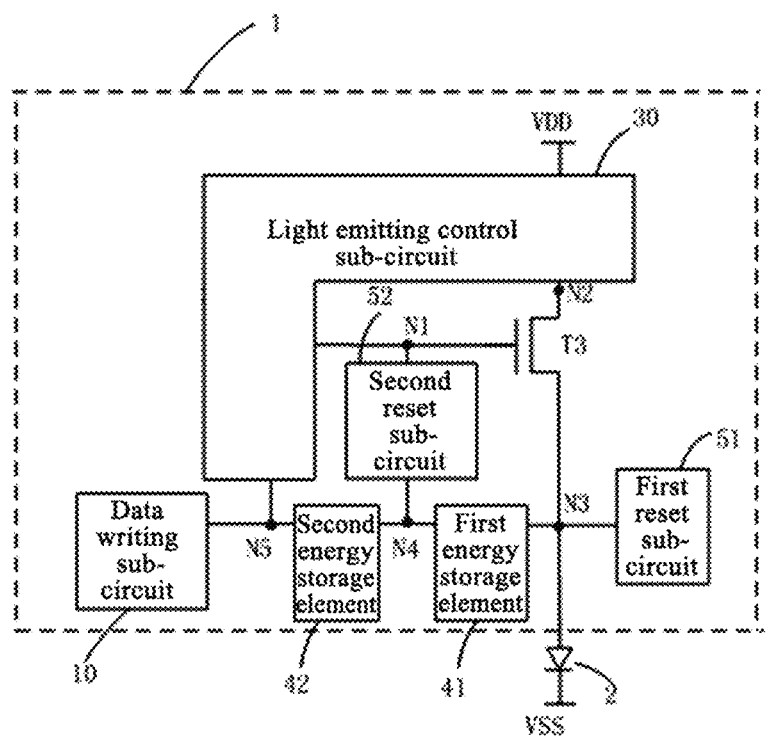
FIG. 3 is a schematic diagram illustrating a pixel driving circuit and a light emitting device provided in some embodiments of the present disclosure.

FIG. 3 is a schematic diagram illustrating a pixel driving circuit and a light emitting device provided in some embodiments of the present disclosure. As shown in FIG. 3, the pixel driving circuit 1 includes a driving transistor T3, a first reset sub-circuit 51, a second reset sub-circuit 52, a light emitting control sub-circuit 30, a data writing sub-circuit 10, a first energy storage element 41, and a second energy storage element 42.

A gate of the driving transistor T3, the second reset sub-circuit 52, and the light emitting control sub-circuit 30 are connected to a first node N1. The light emitting control sub-circuit 30 and a first electrode of the driving transistor T3 are connected to a second node N2. The first reset sub-circuit 51, a second electrode of the driving transistor T3, and the first energy storage element 41 are connected to a third node N3. The second reset sub-circuit 52, the first energy storage element 41 and the second energy storage element 42 are connected to a fourth node N4. The data writing sub-circuit 10, the light emitting control sub-circuit 30, and the second energy storage element 42 are connected to a fifth node N5. The second electrode of the driving transistor T3 is connected to a first electrode of the light emitting device 2, where the light emitting device 2 may be an organic electroluminescent diode, the first electrode of the light emitting device 2 may be an anode, and a second electrode of the light emitting device 2 may be a cathode.

The first reset sub-circuit 51 is configured to write an initialization voltage signal to the third node N3 in response to a first reset signal. The second reset sub-circuit 52 is configured to turn it conductive between the gate of the driving transistor T3 and the fourth node N4 and reset the gate of the driving transistor T3 and the fourth node N4, in response to a second reset signal. The data writing sub-circuit 10 is configured to write a data voltage signal to the second energy storage element 42, that is, to the fifth node N5, in response to a scanning signal. The light emitting control sub-circuit 30 is configured to: turn it conductive between the first electrode of the driving transistor T3 and a power supply terminal in response to a first light emitting control signal; and turn it conductive between the fifth node N5 and the gate of the driving transistor T3 in response to a second light emitting control signal, so that the data voltage signal is transmitted to the gate of the driving transistor T3.

In the embodiment of the present disclosure, it is possible to: in a reset phase, write the initialization voltage signal to the third node N3 through the first reset sub-circuit 51 and write the reset voltage signal to the fourth node N4 through the second reset sub-circuit 52; in a threshold compensation phase, turn it conductive between the first power supply line VDD and the first electrode of the driving transistor T3 through the light emitting control sub-circuit 30, and turn it conductive between the gate of the driving transistor T3 and the fourth node N4 through the second reset sub-circuit 52, so that a threshold voltage of the driving transistor T3 is written to the first energy storage element 41; in a data writing phase, write the data voltage signal to the second energy storage element 42 through the data writing sub-circuit 10; and in a light emitting phase, write the data voltage signal to the gate of the driving transistor T3 and turn it conductive between the power supply terminal and the source of the driving transistor T3 through the light emitting control sub-circuit 30, in which time, the driving transistor T3 provides a driving current for the light emitting device, and the magnitude of the driving current is independent of the threshold voltage.

Moreover, the pixel driving circuit in the present disclosure includes two energy storage elements, and the second reset sub-circuit 52 may reset the fourth node N4 in response to the second reset signal. Therefore, in the data writing phase, the second reset signal can be controlled to be in the operating level state, and the second light emitting control signal can be controlled to be in the non-operating level state. At this time, the fourth node N4 maintains a fixed potential, and the fifth node N5 is cut off from the first node N1, and the voltages at the two nodes do not affect each other. Therefore, when the data voltage signal is written to the second energy storage element 42, the third node N3 will not be affected, thereby improving the display quality.

Figure 4:
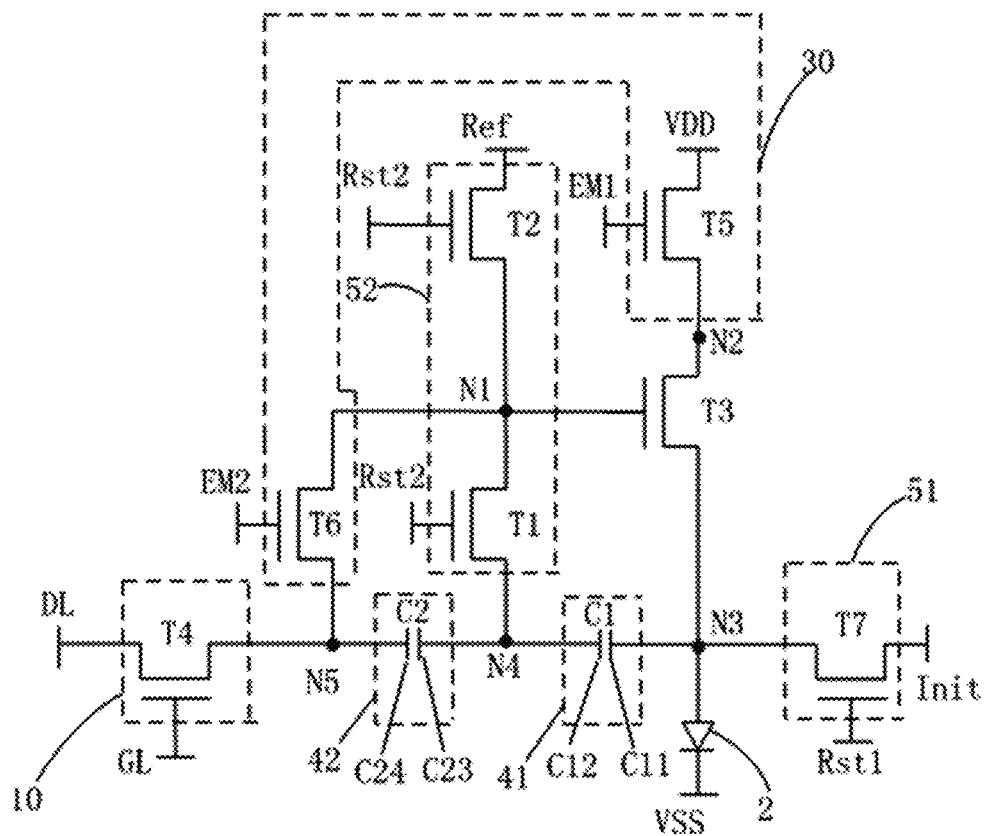
FIG. 4 is a schematic diagram illustrating a pixel driving circuit and a light emitting device provided in some other embodiments of the present disclosure.

FIG. 4 is a schematic diagram illustrating a pixel driving circuit and a light emitting device provided in some other embodiments of the present disclosure. The pixel driving circuit shown in FIG. 4 is a specific implementation of the pixel driving circuit shown in FIG. 3. As shown in FIG. 4, the first reset sub-circuit 51 includes a first reset transistor T7 having a gate connected to a first reset signal line Rst1, a first electrode connected to an initialization signal line Init, and a second electrode connected to the third node N3. The first reset signal line Rst1 serves to provide the first reset signal, and the initialization signal line Init serves to provide the initialization voltage signal.

When the first reset signal reaches the operating level state, it turns conductive between the first and second electrodes of the first reset transistor T7, so that the initialization voltage signal on the initialization signal line Init is transmitted to the third node N3.

The second reset sub-circuit 52 includes a second reset transistor T2 and a third reset transistor T1. A gate of the second reset transistor T2 is connected to a second reset signal line Rst2, a first electrode of the second reset transistor T2 is connected to a reference voltage line, and a second electrode of the second reset transistor T2 is connected to the gate of the driving transistor T3. A gate of the third reset transistor T1 is connected to the second reset signal line Rst2, a first electrode of the third reset transistor T1 is connected to the gate of the driving transistor T3, and a second electrode of the third reset transistor T1 is connected to the fourth node N4.

When the second reset signal reaches the operating level state, it is turned conductive between the first and second electrodes of the second reset transistor T2, and it is also turned conductive between the first and second electrodes of the third reset transistor T1, so that the reference voltage signal on the reference voltage line is transmitted to the gate of the driving transistor T3 and the fourth node N4.

The light emitting control sub-circuit 30 includes a first light emitting control transistor T5 and a second light emitting control transistor T6. A gate of the first light emitting control transistor T5 is connected to a first light emitting control line EM1, a first electrode of the first light emitting control transistor T5 is connected to a power supply terminal, and a second electrode of the first light emitting control transistor T5 is connected to the first electrode of the driving transistor T3. A gate of the second light emitting control transistor T6 is connected to a second light emitting control line EM2, a first electrode of the second light emitting control transistor T6 is connected to the first electrode of the driving transistor T3, and a second electrode of the second light emitting control transistor T6 is connected to the second energy storage element 42. The first light emitting control line EM1 serves to provide the first light emitting control signal, and the second light emitting control line EM2 serves to provide the second light emitting control signal.

When the first light emitting control signal reaches the operating level state, it is turned conductive between the first electrode and the second electrode of the first light emitting control signal transistor T5, so that it is turned conductive between the first power supply line VDD and the first electrode of the driving transistor T3. When the second light emitting control signal reaches the operating level state, it is turned conductive between the first and second electrodes of the second light emitting control transistor T6, so that it is turned conductive between the fifth node N5 and the gate of the driving transistor T3.

As shown in FIG. 4, the data writing sub-circuit 10 includes a data writing transistor T4 having a gate connected to a scanning signal line GL, a first electrode connected to a data signal line, and a second electrode connected to the second energy storage element 42 and the light emitting control sub-circuit 30. The scanning signal line GL serves to provide the scanning signal, and the data signal line serves to provide the data signal.

When the scanning signal reaches the operating level potential, the data writing transistor T4 is turned on, so that the data signal on the data signal line is transmitted to the fifth node N5.

As shown in FIG. 4, the first energy storage element 41 includes a first capacitor C1. The first capacitor C1 includes a first plate C11 and a second plate C12. The first plate C11 is connected to the second electrode of the driving transistor T3 and the first reset sub-circuit 51, and the second plate C12 is connected to the second energy storage element 42 and the second reset sub-circuit 52. The second energy storage element 42 includes a second capacitor C2. The second capacitor C2 includes a third plate C23 and a fourth plate C24. The third plate C23 is connected to the first energy storage element 41 and the second reset sub-circuit 52, and the fourth plate C24 is connected to the data writing sub-circuit 10 and the light emitting control sub-circuit 30.

Figure 5:
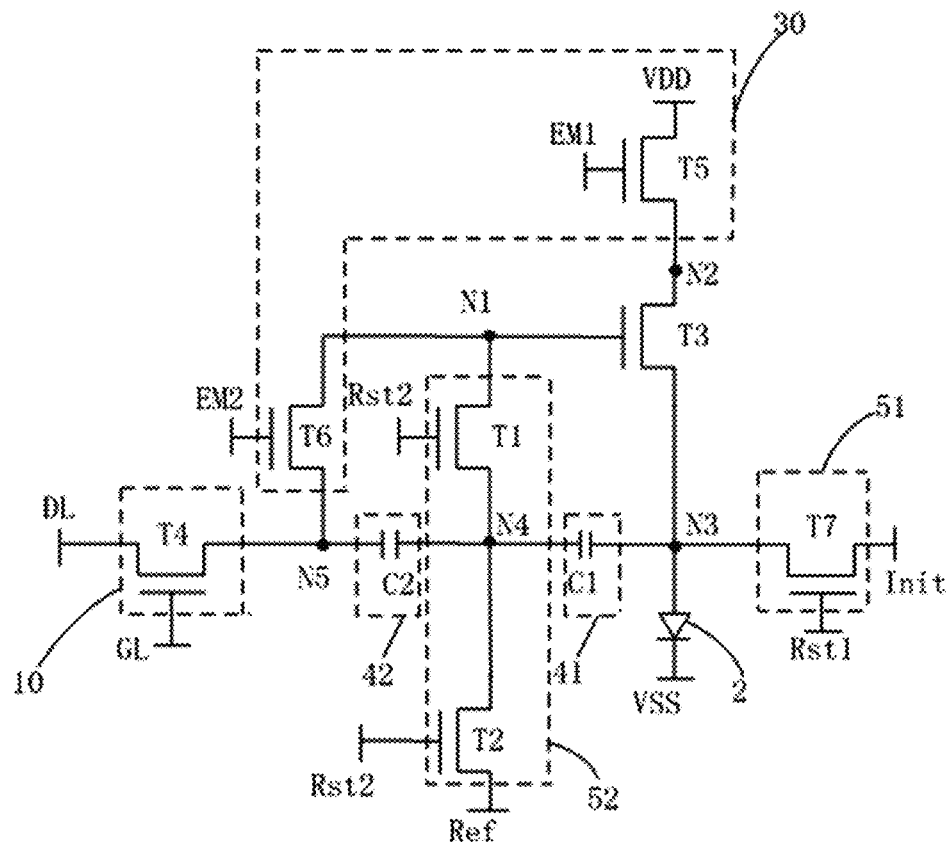
FIG. 5 is a schematic diagram illustrating a pixel driving circuit and a light emitting device provided in some other embodiments of the present disclosure.

FIG. 5 is a schematic diagram illustrating a pixel driving circuit and a light emitting device provided in some other embodiments of the present disclosure. As shown in FIG. 5, the pixel driving circuit shown in FIG. 5 is similar to that shown in FIG. 4 except that transistors in the second reset sub-circuit 52 are connected in a different manner. In FIG. 5, the second reset sub-circuit 52 includes a second reset transistor T2 and a third reset transistor T1. A gate of the second reset transistor T2 is connected to the second reset signal line Rst2, a first electrode of the second reset transistor T2 is connected to the reference voltage line Ref, and a second electrode of the second reset transistor T2 is connected to the fourth node N4. A gate of the third reset transistor T1 is connected to the second reset signal line Rst2, a first electrode of the third reset transistor T1 is connected to the gate of the driving transistor T3, and a second electrode of the third reset transistor T1 is connected to the fourth node N4.

In FIG. 5, when the second reset signal provided by the second reset signal line Rst2 is at the operating level potential, the reference voltage signal on the reference voltage line Ref may also be transmitted to the gate of the driving transistor T3 and the fourth node N4.

In FIG. 5, the specific structures of the other sub-circuits may be the same as those in FIG. 4, and are not repeated herein.

In the embodiment of the present disclosure, at least one transistor in the pixel driving circuit 1 may be a double-gate transistor, where two gates of the double-gate transistor are arranged in a direction away from a base substrate, so that a situation that an active layer of the transistor generates a leakage current due to illumination can be reduced, and characteristics of the transistor can be improved. In one example, each transistor in the pixel driving circuit 1 may be provided as a double-gate transistor. Alternatively, a part of the transistors in the pixel driving circuit 1 may be provided as double-gate transistors, and the rest transistors may be provided as single-gate transistors. For example, the driving transistor may be provided as a double-gate transistor, and the rest transistors may be provided as single-gate transistors.

Figure 6A:
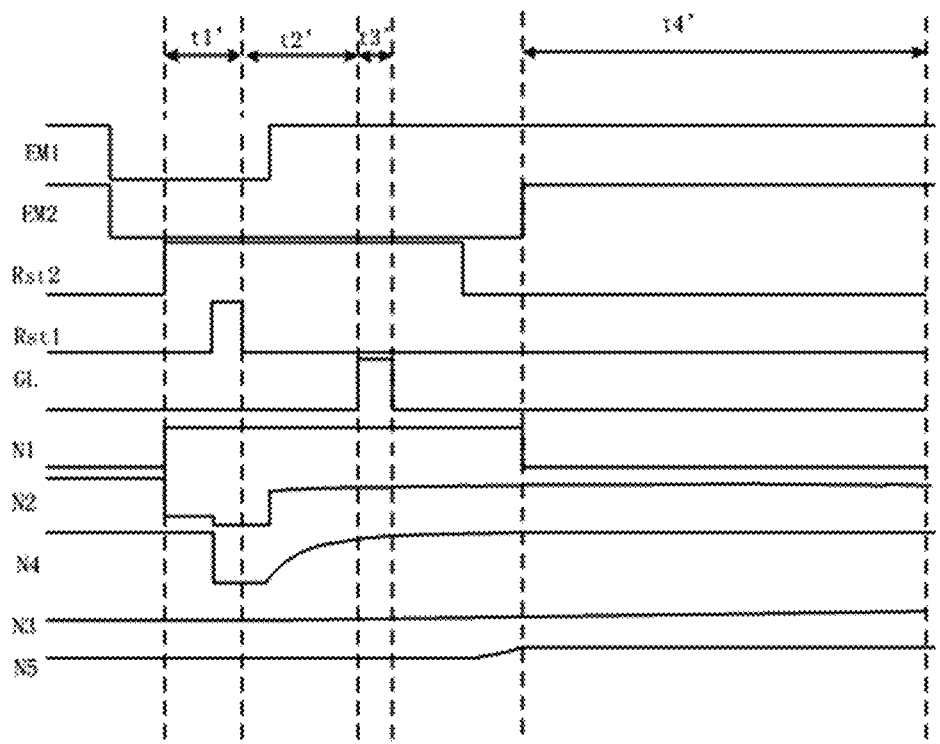
FIG. 6A is a diagram illustrating a timing of a pixel driving circuit provided in some embodiments of the present disclosure.
Figure 6B:
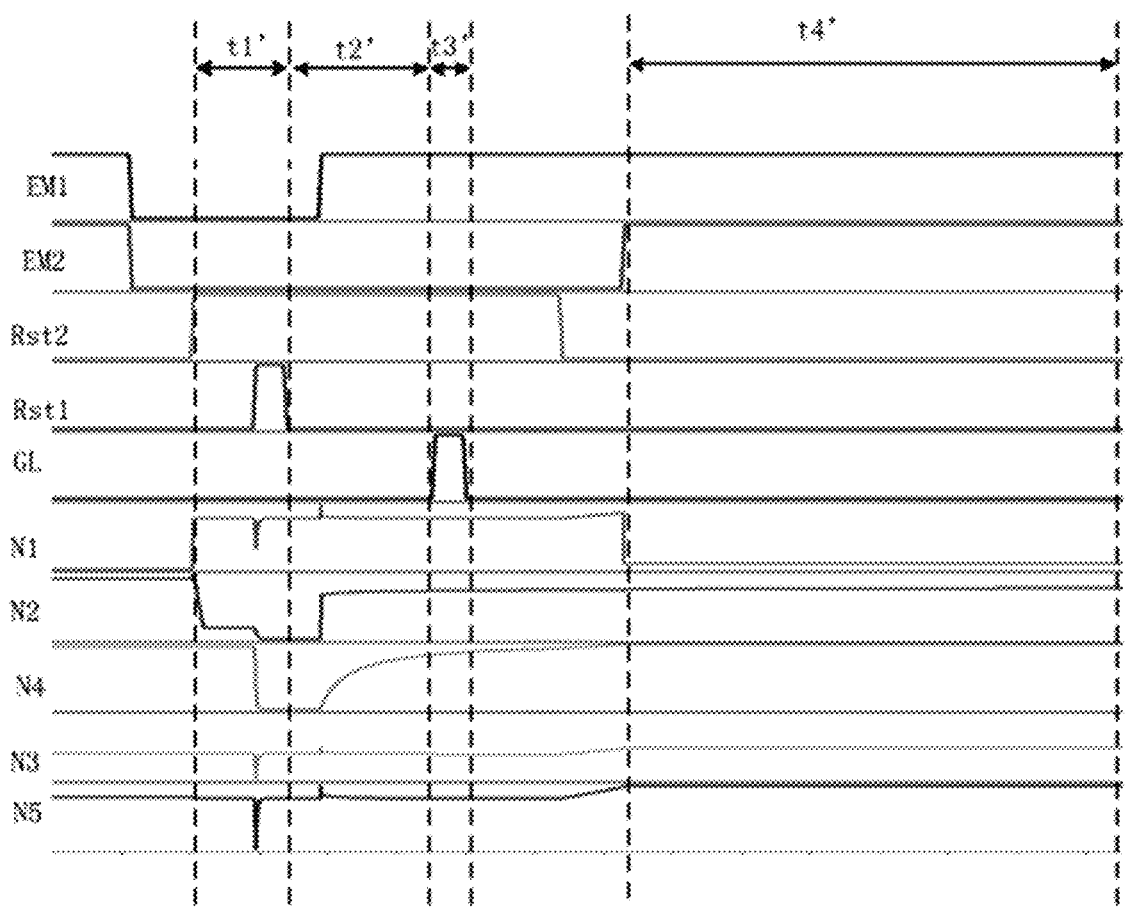
FIG. 6B is a diagram illustrating a simulation of signals of a pixel driving circuit provided in some embodiments of the present disclosure.

FIG. 6A is a diagram illustrating a timing of a pixel driving circuit provided in some embodiments of the present disclosure, and FIG. 6B is a diagram illustrating a simulation of signals of a pixel driving circuit provided in some embodiments of the present disclosure. It is illustrated by taking the pixel driving circuit employing the structure in FIG. 4 as an example. The second electrode of the first light emitting control transistor T5 and the first electrode of the driving transistor T3 are connected to the second node N2, and the gate of the driving transistor T3 and the first electrode of the second light emitting control transistor T6 are connected to the first node N1. As shown in FIGS. 6A and 6B, the operation of the pixel driving circuit includes phases t1 to t4.

In the reset phase t1, the first light emitting control signal provided by the first light emitting control line EM1, the second light emitting control signal provided by the second light emitting control line EM2, and the scanning signal provided by the scanning signal line GL are all in the non-operating level state, so that the first light emitting control transistor T5, the second light emitting control transistor T6, and the data writing transistor T4 are all turned off. The second reset signal provided by the second reset signal line Rst2 reaches the operating level state, so that the second reset transistor T2 and the third reset transistor T1 are turned on, the reference voltage signal provided by the reference voltage line Ref is transmitted to the first node N1 and the fourth node N4, and the potential at each of the first node N1 and the fourth node N4 reaches Vref. Thereafter, the first reset signal provided by the first reset signal line Rst1 reaches the operating level state, so that the first reset transistor T7 is turned on, and the initialization voltage signal on the initialization signal line Init is transmitted to the third node N3.

In the threshold compensation phase t2, the second light emitting control signal provided by the second light emitting control line EM2, the first reset signal provided by the first reset signal line Rst1, and the scanning signal provided by the scanning signal line GL are all in the non-operating level state, and at this time, the second light emitting control transistor T6, the first reset transistor T7, and the data writing transistor T4 are all turned off. In addition, the first light emitting control signal provided by the first light emitting control line EM1 and the second reset signal provided by the second reset signal line Rst2 cause the first light emitting control transistor T5, the second reset transistor T2 and the third reset transistor T1 to be all turned on, and the reference voltage signal provided by the reference voltage line Ref is transmitted to the first node. Since a gate-source voltage of the driving transistor T3 is greater than the threshold voltage, the driving transistor T3 is turned on. The third node N3 is continuously charged till the driving transistor T3 is turned off, in which time a potential at the third node N3 is Vref-Vth. Vref is a voltage of the reference voltage signal, and Vth is the threshold voltage of the driving transistor T3.

In the data writing phase t3, the scanning signal provided by the scanning signal line GL reaches the operating level state, so that the data writing transistor T4 is turned on, and the data signal on the data signal line DL is transmitted to the fifth node N5. The potential at the fifth node N5 is denoted as Vdata. In addition, the first light emitting control signal provided by the first light emitting control line EM1 and the second reset signal on the second reset signal line Rst2 are each in the operating level state, so that the first light emitting control transistor T5, the second reset transistor T2, and the third reset transistor T1 are turned on. The potential at the fourth node N4 is kept Vref. Since the fourth node N4 receives a signal of a fixed potential, the second capacitor is not bootstrapped, thereby ensuring that the fourth node N4 and the third node N3 will not be affected by the data signal. Meanwhile, the second light emitting control signal provided by the second light emitting control line EM2 is in the non-operating level state, so that the second light emitting control transistor is turned off, to prevent the voltage at the fifth node N5 from affecting the first node N1 and the fourth node N4.

In the light emitting phase t4, the first reset signal provided by the first reset signal line Rst1, the second reset signal provided by the second reset signal line Rst2, and the scanning signal provided by the scanning signal line GL are all in the non-operating level state, and the first reset transistor T7, the second reset transistor T2, the third reset transistor T1, and the data writing transistor T4 are all turned off. The first light emitting control signal provided by the first light emitting control line EM1 and the second light emitting control signal provided by the second light emitting control line EM2 are both in the operating level state, so that at this time, the first light emitting control transistor T5 and the second light emitting control transistor T6 are both turned on, and the potential at the third node N3 changes to Vdd. Due to a bootstrap action of the first capacitor C1 and the second capacitor C2, the potentials at the fourth node N4 and the fifth node N5 each change correspondingly. The potential at the fifth node N5 changes to Vdata+Vdd−Vref+Vth, and in turn the potential at the first node N1 reaches Vdata+Vdd−Vref+Vth. The light emitting device 2 emits light under the driving of the driving transistor T3, and at this time, the driving transistor T3 operates in a saturation region, and the gate-source voltage Vgs of the driving transistor T3 is (Vdata+Vdd−Vref+Vth)−Vdd=Vdata−Vref+Vth.

An expression of the driving current of the driving transistor T3 is as follows:

$$IOLED = \beta(Vgs - Vth)^2 = (Vdata - Vref + Vth - Vth)^2 = (Vdata - Vref)^2$$

$$\beta = \frac{1}{2}\mu_n C_{ox}\left(\frac{W}{L}\right),$$

$\mu_n$ is electron mobility of the driving transistor T3, $C_{ox}$ is an insulation capacitance per unit area, and W/L is a width-to-length ratio of the driving transistor.

Although the structure of the circuit in FIG. 5 is different from that of the circuit in FIG. 4, the operation process is the same as that of the circuit in FIG. 4. The timing of signals and the potential change at each node may refer to the above description of FIG. 4, and are not repeated herein.

FIG. 7 is a schematic diagram illustrating a driving method of a pixel driving circuit provided in some embodiments of the present disclosure, where the pixel driving circuit is the pixel driving circuit in any of the embodiments described above. As shown in FIG. 7, the driving method of the pixel driving circuit includes steps S1 to S4.

S1, in a reset phase, writing the initialization voltage signal to the third node through the first reset sub-circuit, turning it conductive between the gate of the driving transistor and the fourth node through the second reset sub-circuit, and resetting the gate of the driving transistor and the fourth node, where the first reset signal and the second reset signal are each in an operating level state.

S2, in a threshold compensation phase, turning it conductive between the gate of the driving transistor and the fourth node through the second reset sub-circuit, to write a threshold voltage of the driving transistor to the first energy storage element, where the first light emitting control signal and the second reset signal are each in the operating level state.

S3, in a data writing phase, writing the data voltage signal into the second energy storage element through the data writing sub-circuit, and resetting the fourth node through the second reset sub-circuit, where the second reset signal and the scanning signal are each in the operating level state.

S4, in a light emitting phase, turning it conductive between the first electrode of the driving transistor and the power supply terminal and transmitting the data voltage signal to the gate of the driving transistor, through the light emitting control sub-circuit, so that the driving transistor provides a driving current for a light emitting device, where the first light emitting control signal and the second light emitting control signal are each in the operating level state.

The specific driving process of the pixel driving circuit is described above, and is not repeated herein.

Figure 8:
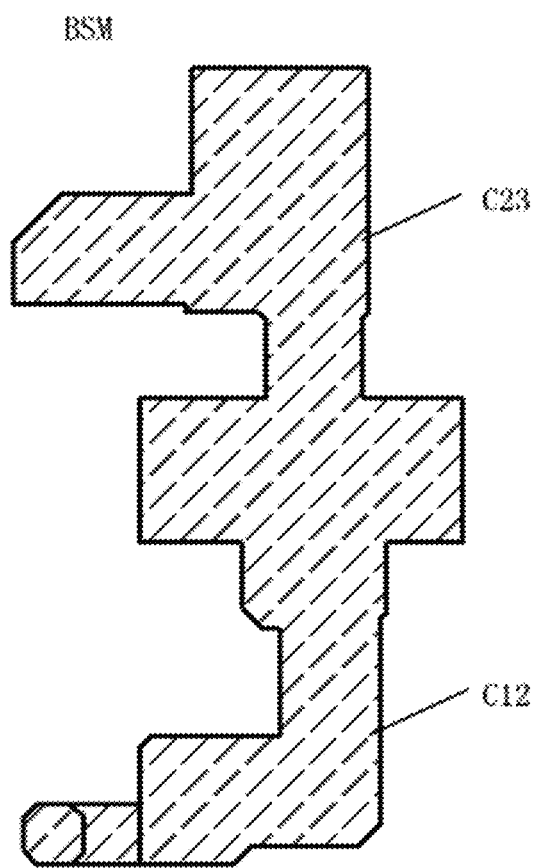
FIG. 8 is a schematic plan view of a light shielding metal layer in a pixel driving circuit provided in some embodiments of the present disclosure.
Figure 9:
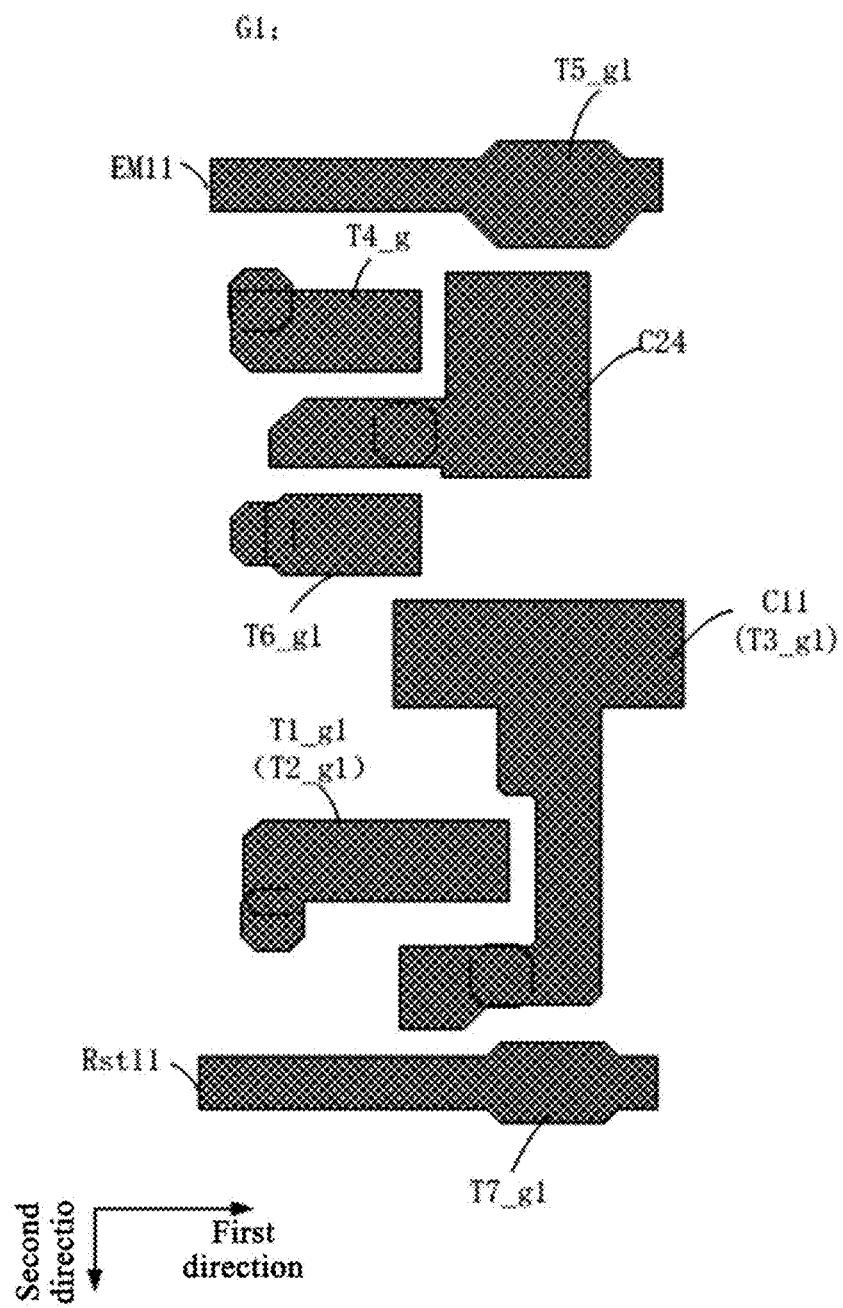
FIG. 9 is a schematic plan view of a first gate metal layer in a pixel driving circuit provided in some embodiments of the present disclosure.
Figure 10:
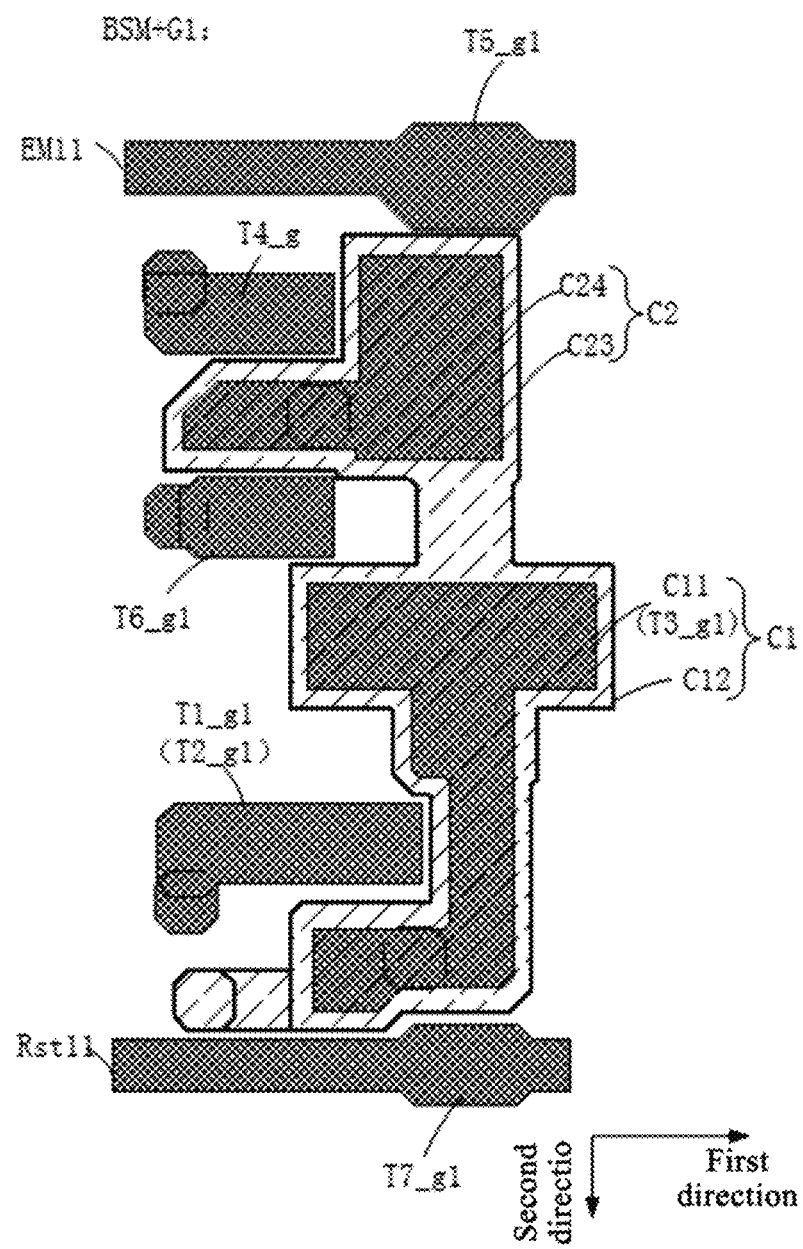
FIG. 10 is a schematic diagram illustrating a light shielding metal layer and a first gate metal layer stacked together in a pixel driving circuit provided in some embodiments of the present disclosure.
Figure 11:
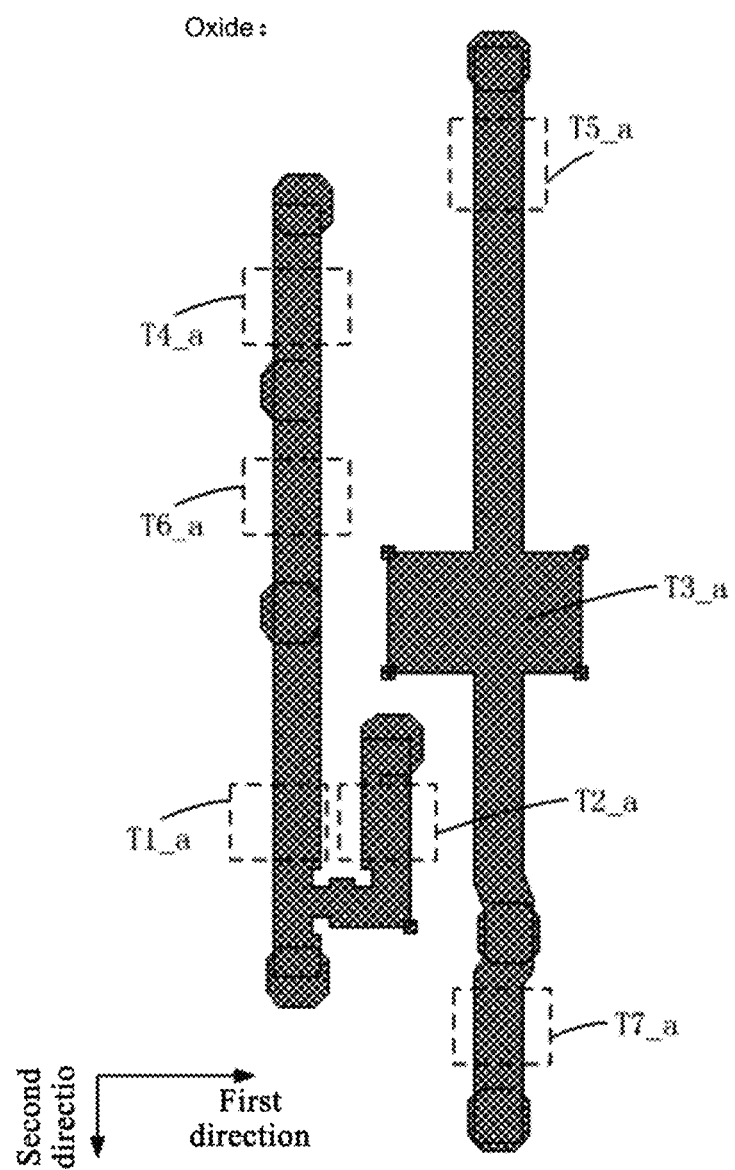
FIG. 11 is a schematic plan view of a semiconductor layer in a pixel driving circuit provided in some embodiments of the present disclosure.
Figure 12:
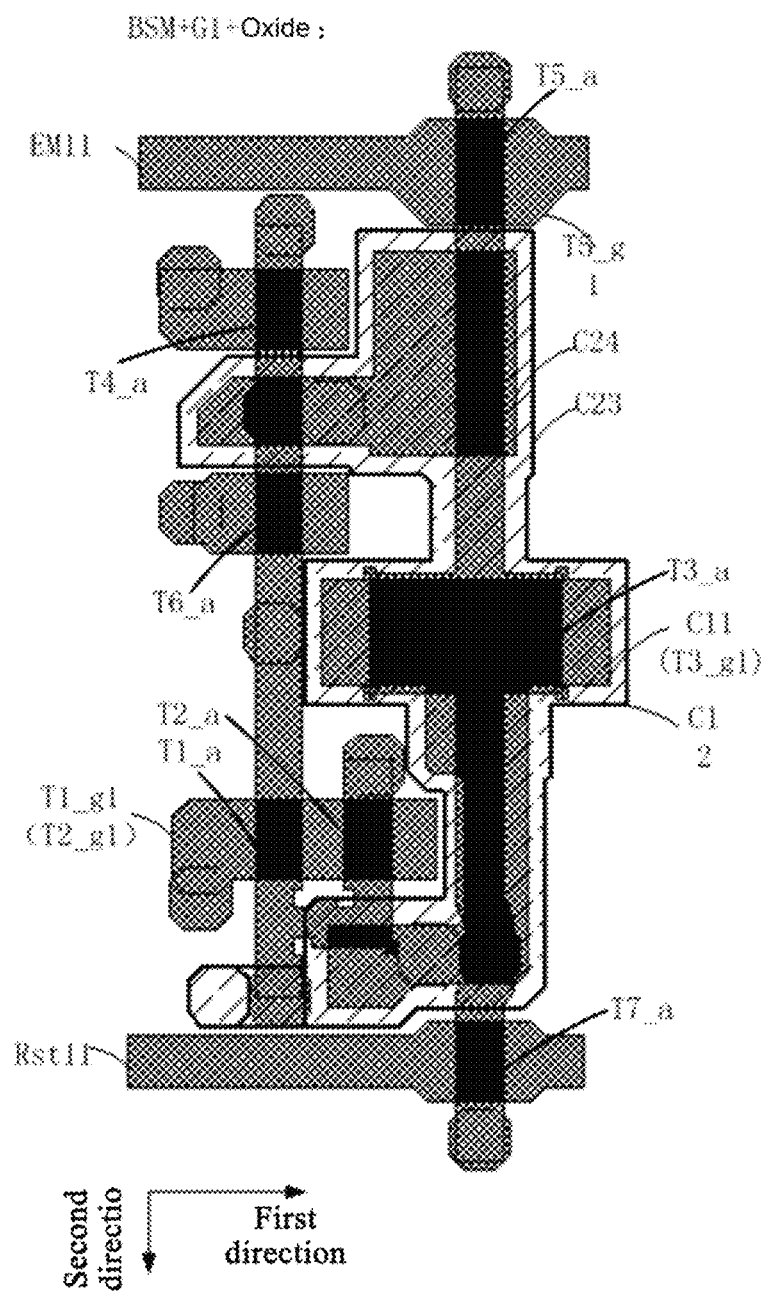
FIG. 12 is a schematic diagram illustrating a light shielding metal layer, a first gate metal layer, and a semiconductor layer stacked together in a pixel driving circuit provided in some embodiments of the present disclosure.
Figure 13:
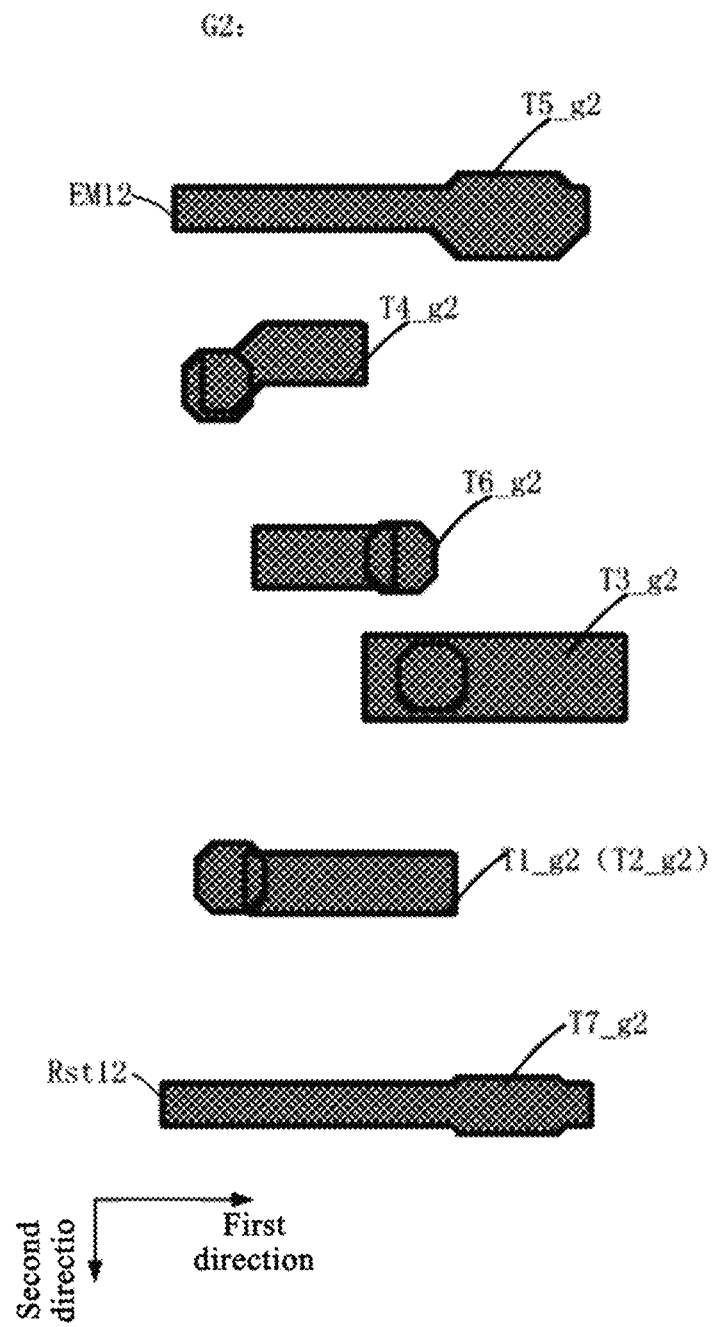
FIG. 13 is a schematic plan view of a second gate metal layer in a pixel driving circuit provided in some embodiments of the present disclosure.
Figure 14:
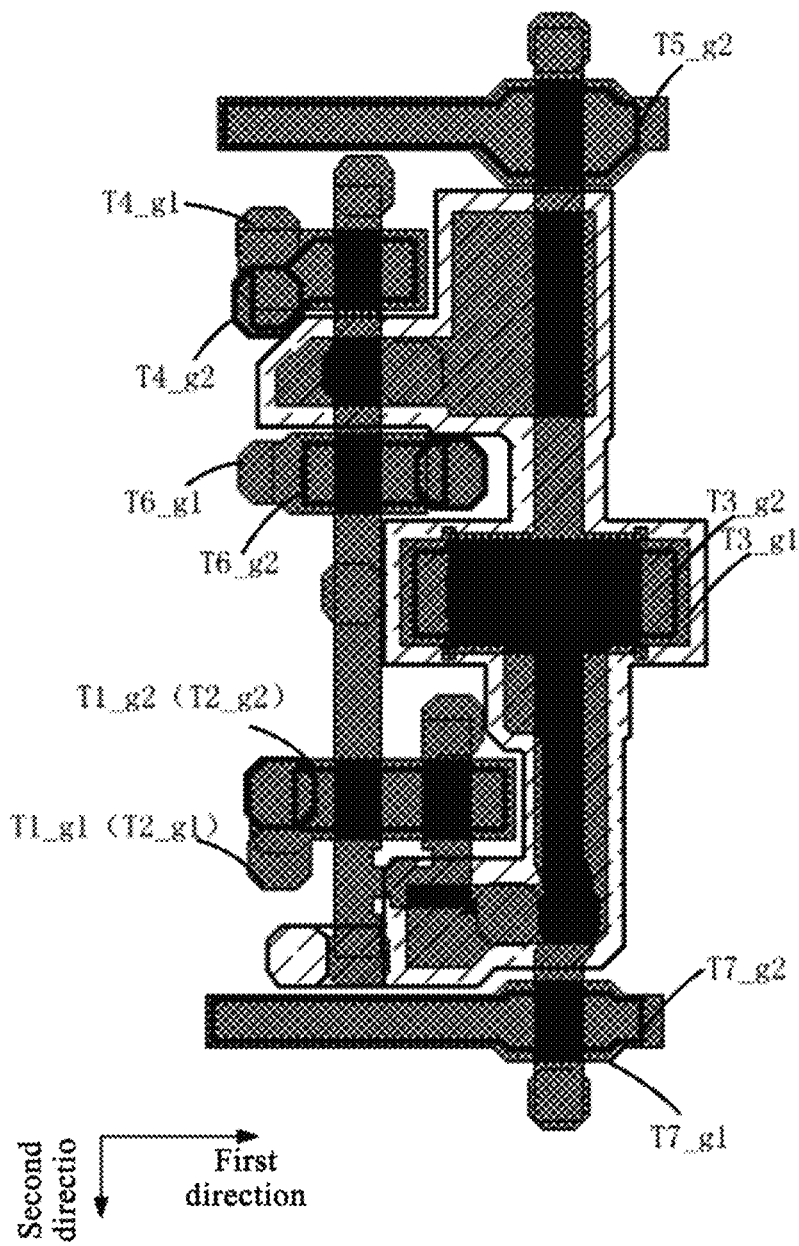
FIG. 14 is a schematic diagram illustrating a light shielding metal layer, a first gate metal layer, a semiconductor layer, and a second gate metal layer stacked together in a pixel driving circuit provided in some embodiments of the present disclosure.
Figure 15:
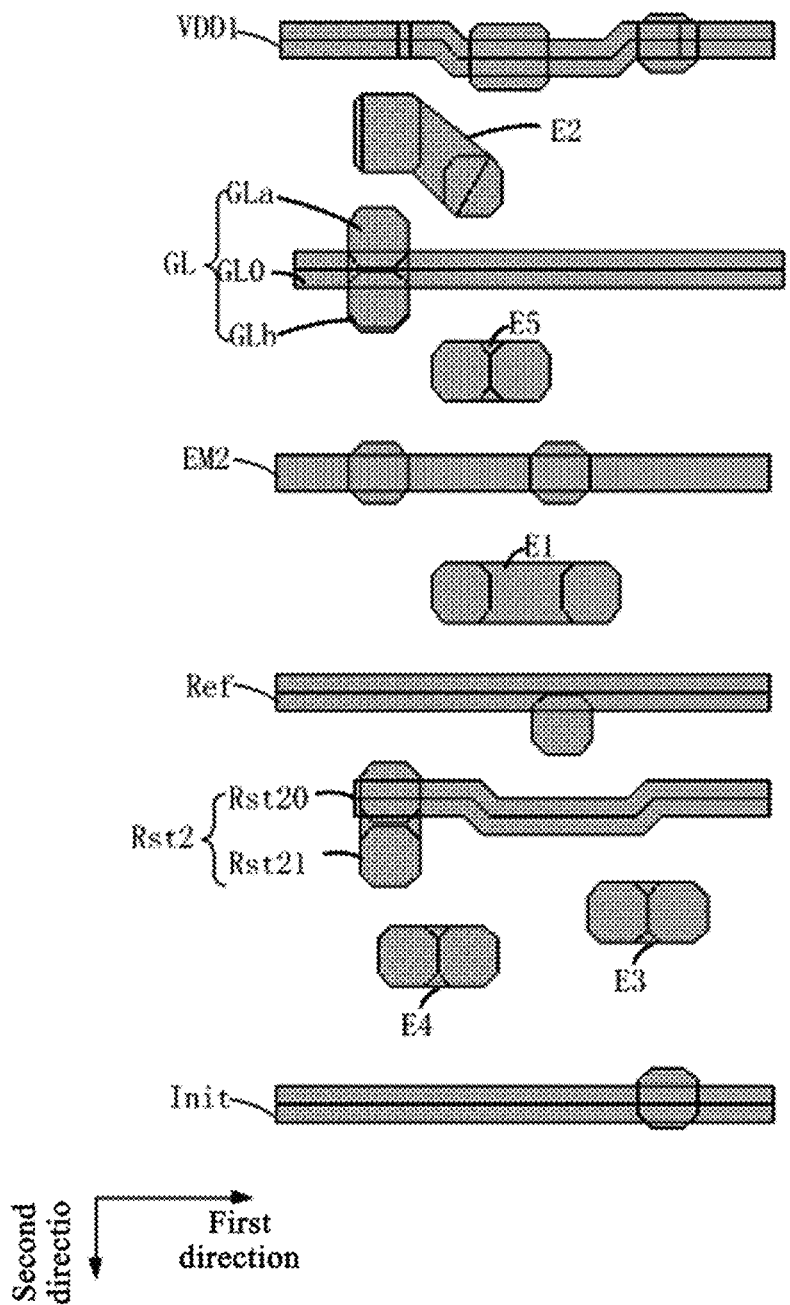
FIG. 15 is a schematic plan view of a first source/drain metal layer in a pixel driving circuit provided in some embodiments of the present disclosure.
Figure 16:
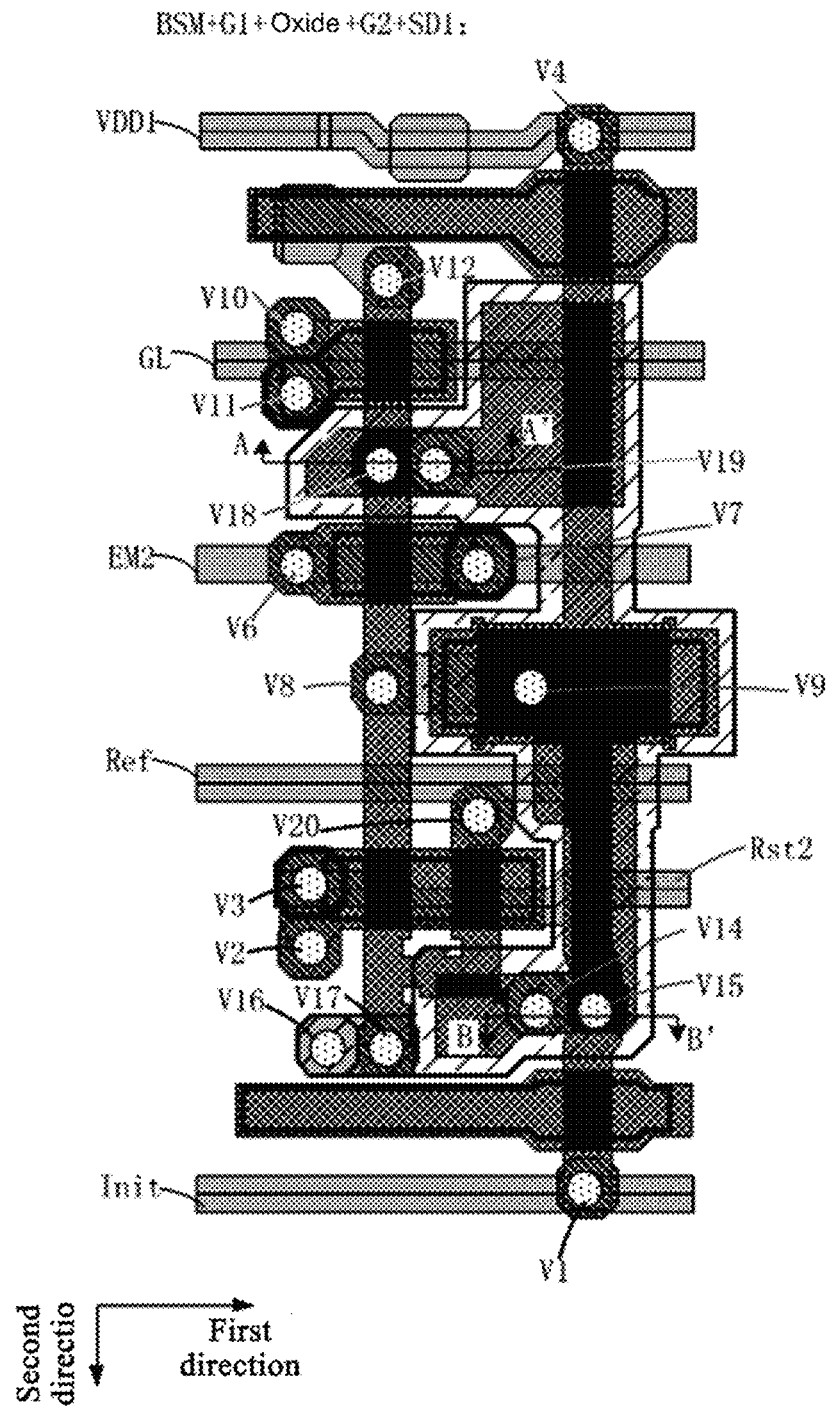
FIG. 16 is a schematic diagram illustrating a light shielding metal layer, a first gate metal layer, a semiconductor layer, a second gate metal layer, and a first source/drain metal layer stacked together in a pixel driving circuit provided in some embodiments of the present disclosure.
Figure 17:
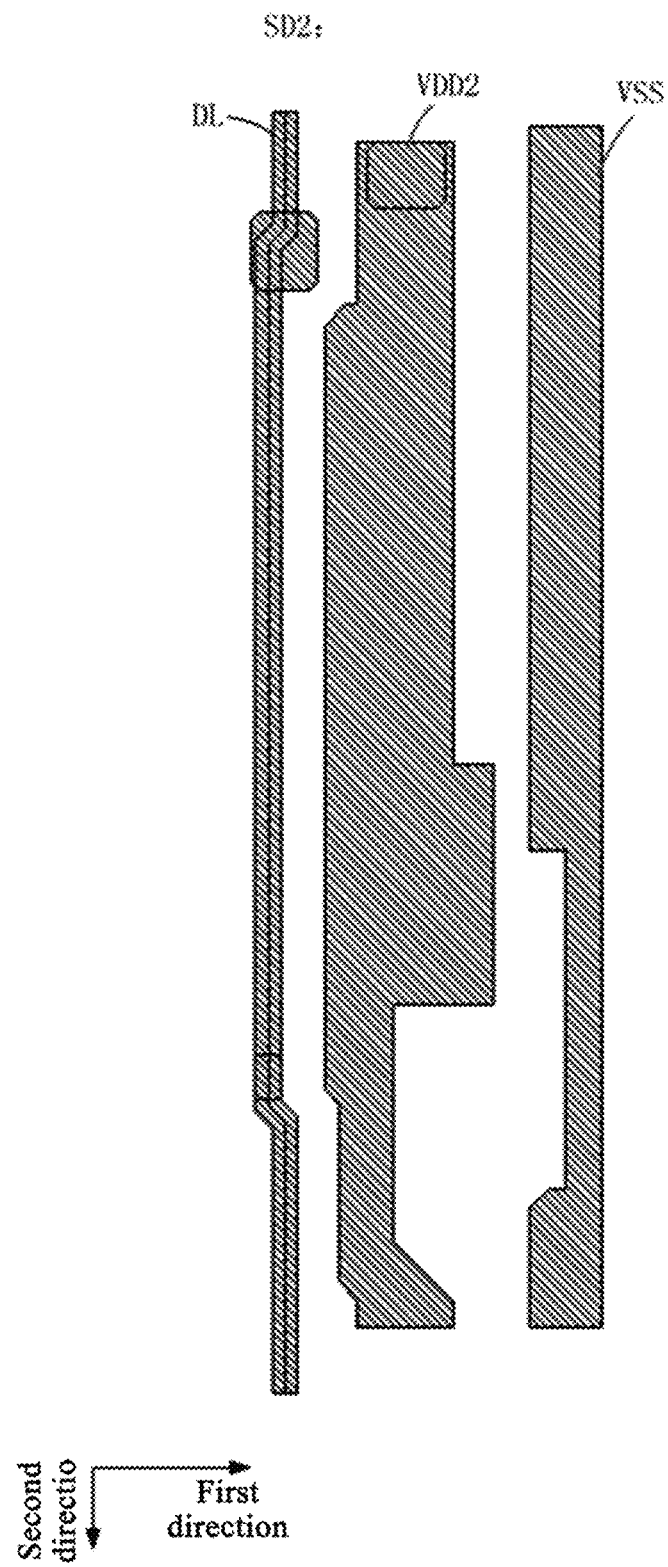
FIG. 17 is a schematic plan view of a second source/drain metal layer in a pixel driving circuit provided in some embodiments of the present disclosure.
Figure 18:
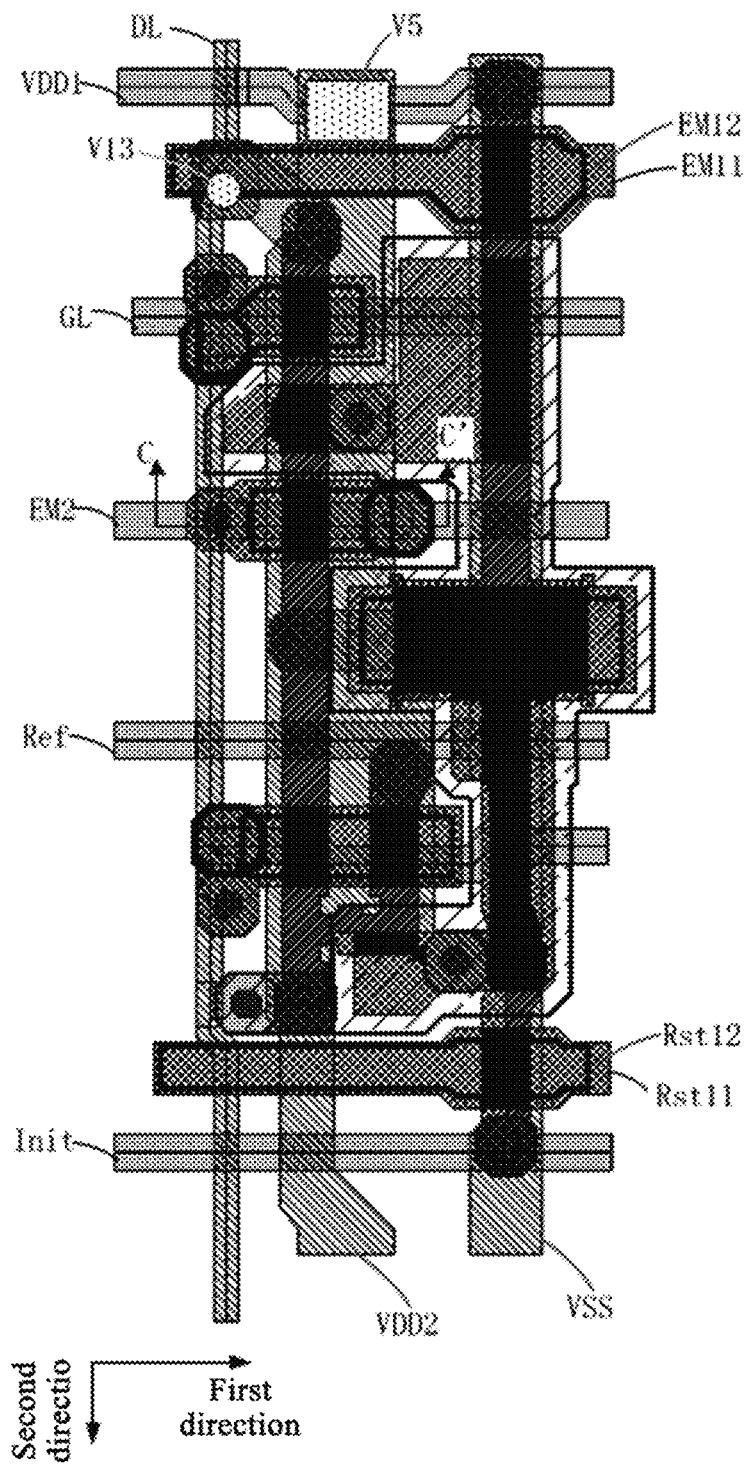
FIG. 18 is a plan view of an entirety of a pixel driving circuit provided in some embodiments of the present disclosure.

Taking the pixel driving circuit in FIG. 5 as an example, a layout of the pixel driving circuit will be described. FIG. 8 is a schematic plan view of a light shielding metal layer in a pixel driving circuit provided in some embodiments of the present disclosure, FIG. 9 is a schematic plan view of a first gate metal layer in a pixel driving circuit provided in some embodiments of the present disclosure, FIG. 10 is a schematic diagram illustrating a light shielding metal layer and a first gate metal layer stacked together in a pixel driving circuit provided in some embodiments of the present disclosure, FIG. 11 is a schematic plan view of a semiconductor layer in a pixel driving circuit provided in some embodiments of the present disclosure, FIG. 12 is a schematic diagram illustrating a light shielding metal layer, a first gate metal layer, and a semiconductor layer stacked together in a pixel driving circuit provided in some embodiments of the present disclosure, FIG. 13 is a schematic plan view of a second gate metal layer in a pixel driving circuit provided in some embodiments of the present disclosure, FIG. 14 is a schematic diagram illustrating a light shielding metal layer, a first gate metal layer, a semiconductor layer, and a second gate metal layer stacked together in a pixel driving circuit provided in some embodiments of the present disclosure, FIG. 15 is a schematic plan view of a first source/drain metal layer in a pixel driving circuit provided in some embodiments of the present disclosure, FIG. 16 is a schematic diagram illustrating a light shielding metal layer, a first gate metal layer, a semiconductor layer, a second gate metal layer, and a first source/drain metal layer stacked together in a pixel driving circuit provided in some embodiments of the present disclosure, FIG. 17 is a schematic plan view of a second source/drain metal layer in a pixel driving circuit provided in some embodiments of the present disclosure, FIG. 18 is a plan view of an entirety of a pixel driving circuit provided in some embodiments of the present disclosure, FIG. 19 is a cross-sectional view taken along a line A-A' in FIG. 16, FIG. 20 is a cross-sectional view taken along a line B-B' in FIG. 16, and FIG. 21 is a cross-sectional view taken along a line C-C' in FIG. 18.

As shown in FIGS. 8 to 21, the pixel driving circuit includes a light shielding metal layer BSM, a first gate metal layer G1, a semiconductor layer Oxide, a second gate metal layer G2, a first source/drain metal layer SD1, and a second source/drain metal layer SD2, which are arranged in a direction away from a base substrate 101.

As shown in FIG. 8, the light shielding metal layer BSM is arranged on a base substrate 101, and the light shielding metal layer BSM may include the second plate C12 of the first capacitor C1 and the third plate C23 of the second capacitor C2 in FIG. 8. The second plate C12 and the third plate C23 are electrically connected together. In one example, the second plate C12 and the third plate C23 are connected as a one-piece structure. It should be noted that, in other examples, the second plate C12 and the third plate C23 may be separately arranged and connected through another conductive structure. The light shielding metal layer BSM may include, for example, a metal, a metal alloy, a metal nitride, a conductive metal oxide, a transparent conductive material, and the like. For example, the light shielding metal layer BSM may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), and the like. The light shielding metal layer BSM may have a single layer or a plurality of layers.

Figure 19:
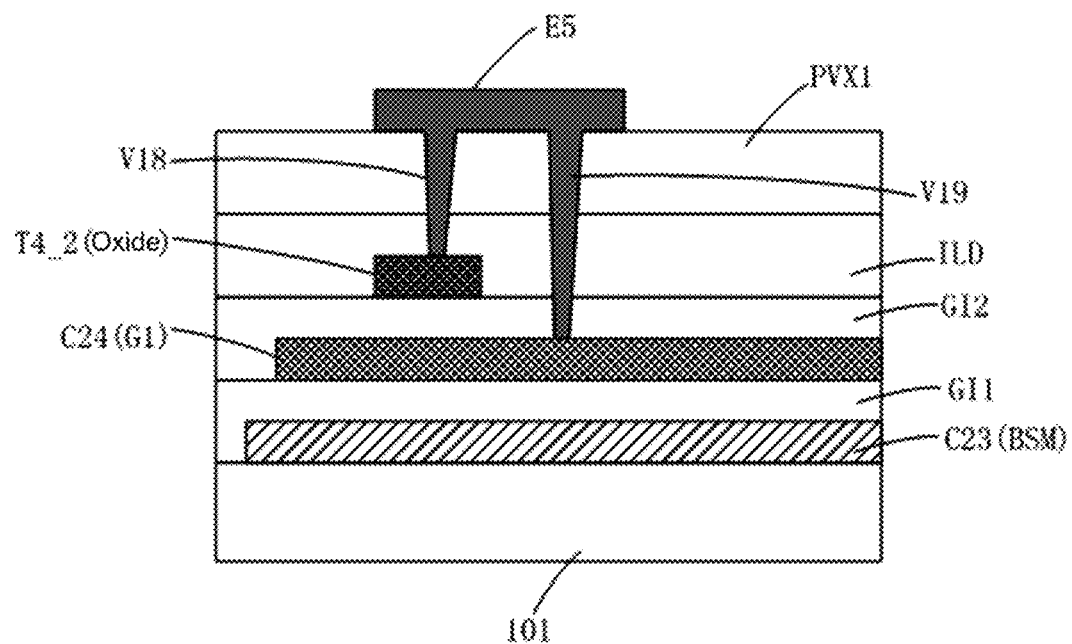
FIG. 19 is a cross-sectional view taken along a line A-A' in FIG. 16.
Figure 20:
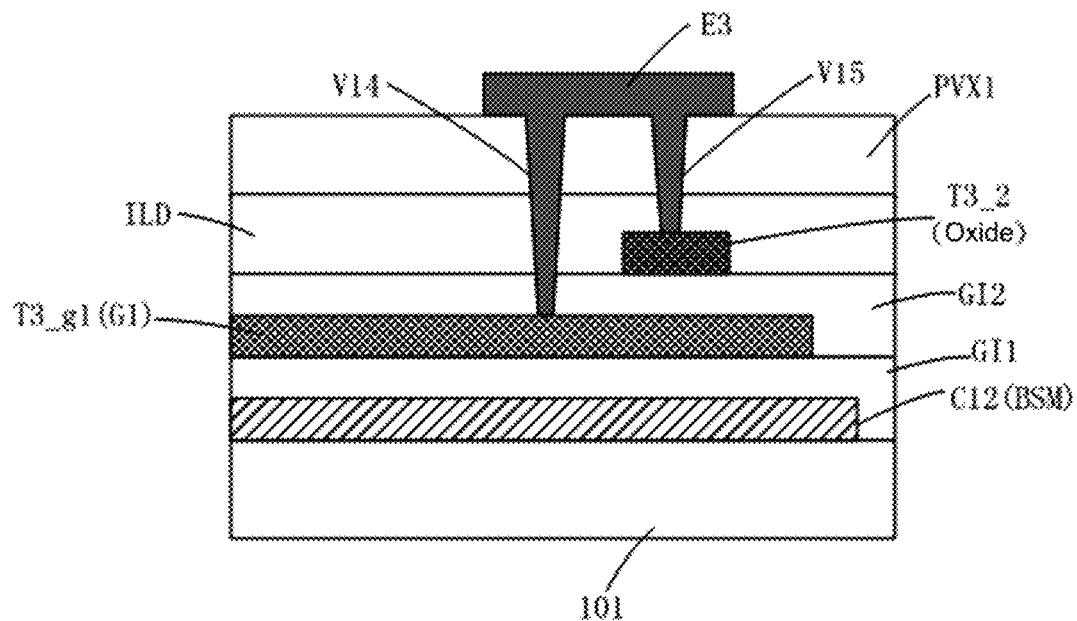
FIG. 20 is a cross-sectional view taken along a line B-B' in FIG. 16.
Figure 21:
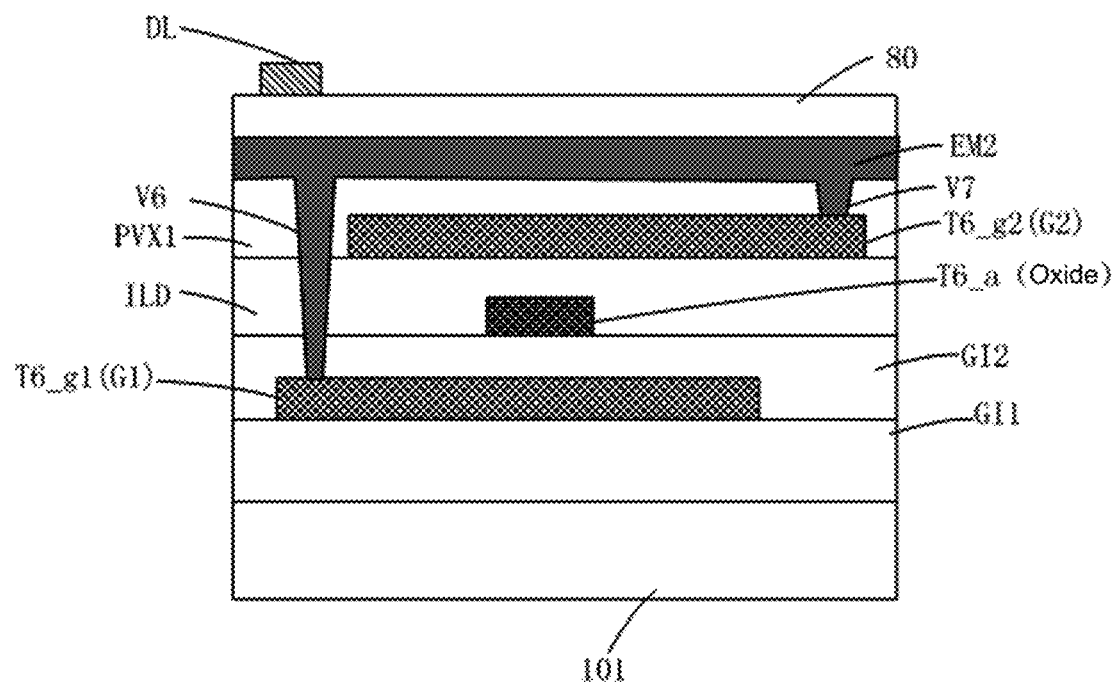
FIG. 21 is a cross-sectional view taken along a line C-C' in FIG. 18.

As shown in FIGS. 19 to 21, the first gate insulating layer GI1 is arranged between the light shielding metal layer BSM and the first gate metal layer G1. The first gate insulating layer GI1 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. The first gate insulating layer GI1 may be formed into a single layer or a plurality of layers.

As shown in FIGS. 9, 10, and 19 to 21, the first gate metal layer G1 is arranged on a side of the first gate insulating layer GI1 away from the base substrate 101. The first gate metal layer G1 includes first gates of the respective transistors in the pixel driving circuit, the fourth plate C24 of the second capacitor C2, and the first plate C11 of the first capacitor C1. The first plate C11 of the first capacitor C1 and the first gate T3_g1 of the driving transistor T3 are of a one-piece structure. The first gate T2_g1 of the second reset transistor T2 and the first gate T1_g1 of the third reset transistor T1 are formed as a one-piece structure. In addition, the first light emitting control line EM1 may include a first control sub-line EM11 and a second control sub-line EM12, and the first reset signal line Rst1 includes a first reset sub-line Rst11 and a second reset sub-line Rst12. The first control sub-line EM11 and the first reset sub-line Rst11 are located in the first gate metal layer G1. The first gate T5_g1 of the first light emitting control transistor T5 is formed as a one-piece structure with the first control sub-line EM11, and the first gate T7_g1 of the first reset transistor T7 is formed as a one-piece structure with the first reset sub-line Rst11.

The first control sub-line EM11, the second control sub-line EM12, the first reset sub-line Rst11, and the second reset sub-line Rst12 may all extend in a first direction.

It should be noted that the signal line "extending in the first direction" (or "extending in the second direction") in the embodiment of the present disclosure does not necessarily mean that the signal line is necessarily a straight line. The signal line may be bent to some extent, as long as the signal line as a whole tends to extend in the first direction (or the second direction).

The first gate metal layer G1 may include, for example, a metal, a metal alloy, a metal nitride, a conductive metal oxide, a transparent conductive material, and the like. For example, the first gate metal layer G1 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), and the like. The first gate metal layer G1 may have a single layer or a plurality of layers.

As shown in FIGS. 19 to 21, a second gate insulating layer GI2 is arranged on a side of the first gate metal layer G1 away from the base substrate 101. The second gate insulating layer GI2 may include silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like. The first gate insulating layer GI1 may be formed into a single layer or a plurality of layers.

As shown in FIGS. 11, 12, and 19 to 21, the semiconductor layer Oxide is arranged on a side of the second gate insulating layer GI2 away from the base substrate 101. The semiconductor layer Oxide may include active layers T1_a to T7_a and doped region patterns of respective transistors (i.e., the third reset transistor T1, the second reset transistor T2, the driving transistor T3, the data writing transistor T4, the first light emitting control transistor T5, the second light emitting control transistor T6, and the first reset transistor T7) in the pixel driving circuit. The active layers and the doped region patterns of the respective transistors in a same first pixel circuit are integrally formed. For a same transistor, two sides of the active layer of the transistor are provided with doped region patterns, respectively, and the doped region patterns on the two sides of the active layer may serve as a first electrode and a second electrode of the transistor, respectively. The active layers T1_a to T7_a of the respective transistors are identified in FIG. 11. It should be noted that, in the embodiment of the present disclosure, the position of the active layer of each transistor represents the position of the corresponding transistor.

The second electrode of the first light emitting control transistor T5 is formed as a one-piece structure with the first electrode of the driving transistor T3. The second electrode of the driving transistor T3 is formed as a one-piece structure with the first electrode of the first reset transistor T7. The second electrode of the data writing transistor T4 is formed as a one-piece structure with the second electrode of the second light emitting control transistor T6. The first electrode of the second light emitting control transistor T6 is formed as a one-piece structure with the first electrode of the third reset transistor T1. The second electrode of the third reset transistor T1 is formed as a one-piece structure with the first electrode of the second reset transistor T2.

In one example, the active layer T4_a of the data writing transistor T4, the active layer T6_a of the second light emitting control transistor T6, and the active layer T1_a of the third reset transistor T1 are substantially aligned in a second direction; the active layer T5_a of the first light emitting control transistor T5, the active layer T3_a of the driving transistor T3, and the active layer T7_a of the first reset transistor T7 are substantially aligned in the second direction; and the active layers T1_a of the third reset transistor T1 and T2_a of the second reset transistor T2 are aligned substantially in the first direction.

The semiconductor layer Oxide may be formed through patterning a semiconductor material, which may be an oxide semiconductor material, such as IGZO.

As shown in FIGS. 19 to 21, an interlayer dielectric ILD is arranged on a side of the semiconductor layer Oxide away from the base substrate 101. A material of the interlayer dielectric ILD may be selected from the materials of the first gate insulating layer GI1 and the second gate insulating layer GI2 listed above, and the interlayer dielectric ILD may be of one or more layers.

As shown in FIGS. 13, 14, and 19 to 21, the second gate metal layer G2 is arranged on a side of the interlayer dielectric ILD away from the base substrate 101. The second gate metal layer G2 includes second gates of the respective transistors in the pixel driving circuit, and further includes the second control sub-line EM12 and the second reset sub-line Rst12. The second gate T5_g2 of the first light emitting control transistor T5 is formed as a one-piece structure with the second control sub-line EM12, and the second gate T7_g2 of the first reset transistor T7 is formed as a one-piece structure with the second reset sub-line Rst12.

In some examples, the first control sub-line EM11, the second control sub-line EM12, the first reset sub-line Rst11, and the second reset sub-line Rst12 may all extend to a peripheral region of the display substrate. In the peripheral region, the first control sub-line EM11 and the second control sub-line EM12 are connected together through a via, and the first reset sub-line Rst11 and the second reset sub-line Rst12 are connected together through a via.

In one example, an orthographic projection of the second control sub-line EM12 on the base substrate 101 at least partially overlaps an orthographic projection of the first control sub-line EM11 on the base substrate 101. For example, the orthographic projection of the second control sub-line EM12 on the base substrate 101 substantially coincides with the orthographic projection of the first control sub-line EM11 on the base substrate 101. In one example, an orthographic projection of the second sub-reset line Rst12 on the base substrate 101 at least partially overlaps an orthographic projection of the first sub-reset line Rst11 on the base substrate 101. For example, the orthographic projection of the second sub-reset line Rst12 on the base substrate 101 substantially coincides with the orthographic projection of the first sub-reset line Rst11 on the base substrate 101.

It should be noted that, in the embodiment of the present disclosure, each transistor in the pixel driving circuit is illustrated as a double-gate transistor, but the present disclosure is not limited thereto. Alternatively, an individual transistor in the pixel driving circuit may be a double-gate transistor, and the other transistors may be single-gate transistors, in which case, the first gate and the second gate of the double-gate transistor are located in the first gate metal layer G1 and the second gate metal layer G2, respectively, and the gate of the single-gate transistor may be located in the first gate metal layer G1 or the second gate metal layer G2.

As shown in FIGS. 19 to 21, a first passivation layer PVX1 is arranged on a side of the second gate metal layer G2 away from the base substrate 101. A material of the first passivation layer PVX1 may be selected from the materials of the first gate insulating layer GI1 and the second gate insulating layer GI2 listed above, and the first passivation layer PVX1 may be of one or more layers.

As shown in FIGS. 15, 16, and 19 to 21, the first source/drain metal layer SD1 is located on a side of the first passivation layer PVX1 away from the base substrate 101. A material of the first source/drain metal layer SD1 may be selected from the materials of the first gate metal layer G1 listed above. Alternatively, besides the material of the first gate metal layer G1 listed above, the first source/drain metal layer SD1 may be made of a molybdenum/titanium alloy or a stack, and the stack may be, for example, a titanium/aluminum/titanium stack. The first source/drain metal layer SD1 includes the scanning signal line GL, the second light emitting control line EM2, the reference voltage line Ref, the second reset signal line Rst2, the initialization signal line Init, a first transfer electrode E1, a second transfer electrode E2, a third transfer electrode E3, a fourth transfer electrode E4, and a fifth transfer electrode E5.

The first power supply line VDD includes a first power supply sub-line VDD1 and a second power supply sub-line VDD2. The first power supply sub-line VDD1 is located in the first source/drain metal layer SD1 and extends in the first direction. As shown in FIGS. 15 and 16, the first power supply sub-line VDD1 is connected to the first electrode T5_1 of the first light emitting control transistor T5 through a fourth via V4.

The second transfer electrode E2 is located on a side of the first power supply sub-line VDD1 in the second direction. The second transfer electrode E2 is connected to the first electrode T4_1 of the data writing transistor T4 through a twelfth via V12.

As shown in FIGS. 15 and 16, the scanning signal line GL is located on a side of the second transfer electrode E2 away from the first power supply sub-line VDD1. The scanning signal line GL includes a scanning line body GL0, a first connecting part GLa, and a second connecting part GLb, which are formed as a one-piece structure. The scanning line body GL0 extends in the first direction, the first connecting part GLa and the second connecting part GLb are located at two opposite sides of the scanning line body GL0, respectively, and are aligned in the second direction, where the first direction and the second direction are crossed each other. For example, the first direction is perpendicular to the second direction. The first connecting part GLa is connected to the first gate T4_g1 of the data writing transistor T4 through a tenth via V10, and the second connecting part GLb is connected to the second gate T4_g2 of the data writing transistor T4 through an eleventh via V11.

As shown in FIGS. 15, 16, and 19, the fifth transfer electrode E5 is located between the scanning signal line GL and the second light emitting control line EM2. One end of the fifth transfer electrode E5 is connected to the second electrode T4_2 of the data writing transistor T4 through an eighteenth via V18, and the other end of the fifth transfer electrode E5 is connected to the fourth plate C24 of the second capacitor C2 through a nineteenth via V19.

As shown in FIGS. 10 to 16, the second light emitting control line EM2 is located on a side of the scanning signal line GL away from the first power supply sub-line VDD1, and extends in the first direction. The second light emitting control line EM2 is connected to the first gate T6_g1 of the second light emitting control transistor T6 through a sixth via V6, and is connected to the second gate T6_g2 of the second light emitting control transistor T6 through a seventh via V7, where the sixth via V6 and the seventh via V7 are aligned in the first direction.

As shown in FIGS. 10 to 16, the first transfer electrode E1 is located between the second light emitting control line EM2 and the reference voltage line Ref. The first transfer electrode E1 is connected to the first electrode T6_1 of the second light emitting control transistor T6 through an eighth via V8, and is connected to the second gate T3_g2 of the driving transistor T3 through a ninth via V9.

As shown in FIGS. 10 to 16, the reference voltage line Ref is located on a side of the second light emitting control line EM2 away from the scanning signal line GL, and extends in the first direction. The reference voltage line Ref is connected to the first electrode of the second reset transistor T2 through a twentieth via V20.

As shown in FIGS. 10 to 16, the second reset signal line Rst2 is located on a side of the reference voltage line Ref away from the second light emitting control line EM2, and includes a reset line body Rst20 and a third connecting part Rst21, which are formed as a one-piece structure. The reset line body Rst20 extends in the first direction, and the third connecting part Rst21 is located on a side of the reset line body Rst20 close to the reference voltage line Ref or away from the reference voltage line Ref.

As shown in FIGS. 10 to 16, the third connecting part Rst21 of the second reset signal line Rst2 is connected to the first gate T2_g1 of the second reset transistor T2 and the first gate T1_g1 of the third reset transistor T1 through a second via V2, and the reset line body Rst20 is connected to the second gate T2_g2 of the second reset transistor T2 and the second gate T1_g2 of the third reset transistor T1 through a third via V3.

As shown in FIGS. 10 to 16, the third transfer electrode E3 and the fourth transfer electrode E4 are both located between the second reset signal line Rst2 and the initialization signal line Init. One end of the third transfer electrode E3 is connected to the second gate T3_g2 of the driving transistor T3 through a fourteenth via V14, and the other end of the third transfer electrode E3 is connected to the second electrode T3_2 of the driving transistor T3 through a fifteenth via V15. By connecting the first gate T3_g1 and the second electrode T3_2 of the driving transistor T3, it is beneficial to improve the driving stability of the driving transistor T3.

As shown in FIGS. 8 to 16, one end of the fourth transfer electrode E4 is connected to the second plate C12 through a sixteenth via V16, and the other end of the fourth transfer electrode E4 is connected to the second electrode of the third reset transistor T1 through a seventeenth via V17.

As shown in FIGS. 8 to 16, the initialization signal line Init is located on a side of the second reset signal line Rst2 away from the reference voltage line Ref, and extends in the first direction. An orthographic projection of the initialization signal line Init on the base substrate 101 is located on a side of an orthographic projection of the first reset signal line Rst1 on the base substrate 101 in the second direction. The initialization signal line Init is connected to the first electrode T7_1 of the first reset transistor T7 through a first via V1.

As shown in FIGS. 19 to 21, an insulating spacer layer 80 is located on a side of the first source/drain metal layer SD1 away from the base substrate 101. The insulating spacer layer 80 may include at least one of a second passivation layer and a planarization layer. For example, the insulating spacer layer 80 may include only the second passivation layer; alternatively, the insulating spacer layer 80 may include only the planarization layer; alternatively, the insulating spacer layer 80 may include the second passivation layer and the planarization layer, and the planarization layer is located on a side of the second passivation layer away from the base substrate 101. A material of the second passivation layer may be selected from the materials of the first gate insulating layer GI1 listed above, which are not repeated herein. A material of the planarization layer may include an organic insulating material including, for example, a resin-based material such as polyimide, epoxy, acryl, polyester, photoresist, polyacrylate, polyamide, or siloxane. The second passivation layer PVX2 may be of a single layer or a plurality of layers.

As shown in FIGS. 19 to 21, the second source/drain metal layer SD2 is located on a side of the second passivation layer PVX2 away from the base substrate 101. A material of the second source/drain metal layer SD2 may be selected from the materials of the first gate metal layer G1 listed above. Alternatively, besides the material of the first gate metal layer G1 listed above, the second source/drain metal layer SD2 may also be made of a molybdenum/titanium alloy or a stack, and the stack may be, for example, a titanium/aluminum/titanium stack. As shown in FIG. 17, the second source/drain metal layer SD2 may include the data signal line DL, the second power supply sub-line VDD2, and a second power supply line VSS.

As shown in FIGS. 11, 17, and 18, the data signal line DL extends in the second direction, and is connected to the first electrode T4_1 of the data writing transistor T4 through a thirteenth via V13. The second power supply sub-line VDD2 extends in the second direction, and is connected to the first power supply sub-line VDD1 through a fifth via V5. The first power supply sub-line VDD1 extends in the first direction, and the second power supply sub-line VDD2 extends in the second direction, so that the first power supply line VDD forms a mesh structure, which can reduce the voltage drop on the first power supply line VDD and is beneficial to the uniformity of the displayed image. Orthographic projections of the active layer T2_a of the second reset transistor T2, the active layer T1_a of the third reset transistor T1, the active layer T6_a of the second light emitting control transistor T6, and the active layer T4_a of the data writing transistor on the base substrate 101 are each overlapped with an orthographic projection of the second power supply sub-line VDD2 on the base substrate 101, so that the phenomenon that the transistor generates a leakage current due to illumination can be further reduced, and the electrical characteristics of the transistor can be improved. For example, the orthographic projections of the active layer T2_a, the active layer T1_a, the active layer T6_a and the active layer T4_a on the base substrate 101 are all within the orthographic projection of the second power supply sub-line VDD2 on the base substrate 101.

The second power supply line VSS extends in the second direction, and is located on a side of the second power supply sub-line VDD2 away from the data signal line DL. The second power supply line VSS serves to provide a voltage signal to the second electrode of the light emitting device 2. For example, the second electrode of the light emitting device 2 extends to the peripheral region. In the peripheral region, the second electrode of the light emitting device 2 is connected to the second power supply line VSS through a via. Orthographic projections of the active layer T7_a of the first reset transistor T7, the active layer T5_a of the first light emitting control transistor T5, and the orthographic projection of the active layer T3_a of the driving transistor T3 on the base substrate 101 are each overlapped with an orthographic projection of the second power supply line VSS on the base substrate 101, so that the phenomenon that the transistor generates a leakage current due to illumination can be further reduced, and the electrical characteristics of the transistor can be improved. For example, the orthographic projections of the active layer T7_a, the active layer T5_a and the active layer T3_a on the base substrate 101 are all within the orthographic projection of the second power supply line VSS on the base substrate 101.

An embodiment of the present disclosure further provides a display substrate, which includes the pixel driving circuit in the above embodiment.

The display substrate includes a display region and a peripheral region on the periphery of the display region. The display region includes a plurality of pixel regions, and the pixel regions may be arranged in an array. Each pixel region may be provided with a pixel driving circuit and a light emitting device electrically connected to the pixel driving circuit. In a same row of pixel regions, the data writing transistors of a plurality of pixel driving circuits are connected to a same scanning signal line; the first reset transistors of the plurality of pixel driving circuits are connected to a same first reset signal line; the second reset transistors and the third reset transistors of the plurality of pixel driving circuits are connected to a same second reset signal line; the first light emitting control transistors of the plurality of pixel driving circuits are connected to a same first light emitting control line and a same first power supply line; and the second light emitting control transistors of the plurality of pixel driving circuits are connected to a same second light emitting control line. In a same column of pixel regions, the data writing transistors of a plurality of pixel driving circuits are connected to a same data signal line.

The present disclosure further provides a display apparatus. The display apparatus may include the display substrate as described above. The display apparatus may include any device or product having a display function. For example, the display apparatus may be a smart phone, a mobile phone, an e-book reader, a desktop computer (PC), a laptop PC, a netbook PC, a Personal Digital Assistant (PDA), a Portable Multimedia Player (PMP), a digital audio player, an ambulatory medical device, a camera, a wearable device (e.g., a head-mounted device, an electronic apparel, an electronic bracelet, an electronic necklace, an electronic accessory, an electronic tattoo, or a smart watch), a television, or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A pixel driving circuit, comprising a driving transistor, a first reset sub-circuit, a second reset sub-circuit, a light emitting control sub-circuit, a data writing circuit, a first energy storage element, and a second energy storage element,
  wherein the first reset sub-circuit is configured to write an initialization voltage signal to a third node in response to a first reset signal, wherein the third node is a connection node between a second electrode of the driving transistor and a first end of the first energy storage element;
  the second reset sub-circuit is configured to, in response to a second reset signal, turn it conductive between a gate of the driving transistor and a fourth node and reset the gate of the driving transistor and the fourth node, wherein the fourth node is a connection node among the first energy storage element, the second energy storage element and the second reset sub-circuit;
  the data writing sub-circuit is configured to write a data voltage signal to the second energy storage element in response to a scanning signal; and
  the light emitting control sub-circuit is configured to turn it conductive between a first electrode of the driving transistor and a power supply terminal in response to a first light emitting control signal, and transmit the data voltage signal to the gate of the driving transistor in response to a second light emitting control signal,
  wherein the second reset sub-circuit comprises a second reset transistor and a third reset transistor,
  wherein a gate of the second reset transistor is connected to a second reset signal line, a first electrode of the second reset transistor is connected to a reference voltage line, and a second electrode of the second reset transistor is connected to the fourth node; and
  a gate of the third reset transistor is connected to the second reset signal line, a first electrode of the third reset transistor is connected to the gate of the driving transistor, and a second electrode of the third reset transistor is connected to the fourth node,
  wherein the second reset transistor and the third reset transistor are both double-gate transistors, a first gate of the second reset transistor and a first gate of the third reset transistor are of a one-piece structure, and a second gate of the second reset transistor and a second gate of the third reset transistor are of a one-piece structure; and
  the second reset signal line is connected to the first gate of the second reset transistor and the first gate of the third reset transistor through a second via, and is connected to the second gate of the second reset transistor and the second gate of the third reset transistor through a third via.

2. The pixel driving circuit according to claim 1, wherein the first reset sub-circuit comprises first reset transistor, wherein a gate of the first reset transistor is connected to a first reset signal line, a first electrode of the first reset transistor is connected to an initialization signal line, and a second electrode of the first reset transistor is connected to the third node,
  wherein the initialization signal line extends in a first direction, an orthogonal projection of the initialization signal line on a base substrate is on a side of an orthogonal projection of the first reset signal line on the base substrate in a second direction, and the first direction intersects with the second direction; and the initialization signal line is connected to the first electrode of the first reset transistor through a first via.

3. The pixel driving circuit according to claim 1, wherein the light emitting control sub-circuit comprises a first light emitting control transistor and a second light emitting control transistor,
  wherein a gate of the first light emitting control transistor is connected to a first light emitting control line, a first electrode of the first light emitting control transistor is connected to a first power supply line, and a second electrode of the first light emitting control transistor is connected to the first electrode of the driving transistor; and a gate of the second light emitting control transistor is connected to a second light emitting control line, a first electrode of the second light emitting control transistor is connected to the gate of the driving transistor, and a second electrode of the second light emitting control transistor is connected to the second energy storage element.

4. The pixel driving circuit according to claim 3, wherein the first power supply line comprises a first power supply sub-line extending in a first direction and a second power supply sub-line extending in a second direction, wherein the first direction intersects with the second direction; and the first power supply sub-line is connected to the first electrode of the first light emitting control transistor through a fourth via, and the second power supply sub-line is connected to the first power supply sub-line through a fifth via, wherein the second light emitting control transistor is a double-gate transistor, the second light emitting control line is connected to a first gate of the second light emitting control transistor through a sixth via and connected to a second gate of the second light emitting control transistor through a seventh via, and the second light emitting control line extends in the first direction.

5. The pixel driving circuit according to claim 3, wherein the pixel driving circuit further comprises a first transfer electrode, wherein the first transfer electrode is connected to the first electrode of the second light emitting control transistor through an eighth via, and is connected to the gate of the driving transistor through a ninth via.

6. The pixel driving circuit according to claim 1, wherein the data writing sub-circuit comprises a data writing transistor, wherein a gate of the data writing transistor is connected to a scanning signal line, a first electrode of the data writing transistor is connected to a data signal line, and a second electrode of the data writing transistor is connected to the second energy storage element and the light emitting control sub-circuit.

7. The pixel driving circuit according to claim 6, wherein the data signal line extends in a second direction, and the scanning signal line comprises a scanning line body, a first connecting part, and a second connecting part, which are formed as a one-piece structure, wherein the scanning line body extends in a first direction, and the first connecting part and the second connecting part are on two opposite sides of the scanning line body, respectively, and are aligned in a second direction; wherein the first direction intersects with the second direction; and the data writing transistor is a double-gate transistor, the first connecting part is connected to a first gate of the data writing transistor through a tenth via, and the second connecting part is connected to a second gate of the data writing transistor through an eleventh via.

8. The pixel driving circuit according to claim 1, wherein the first energy storage element comprises a first capacitor, wherein the first capacitor comprises a first plate and a second plate, the first plate is connected to the second electrode of the driving transistor, and the second plate is connected to the second energy storage element, wherein the first plate is on a side of the second plate away from a base substrate, the driving transistor is a double-gate transistor, a second gate of the driving transistor is on a side of a first gate of the driving transistor away from the base substrate, and the first gate of the driving transistor is shared with the first plate.

9. The pixel driving circuit according to claim 8, wherein the pixel driving circuit further comprises a third transfer electrode, wherein one end of the third transfer electrode is connected to the first gate of the driving transistor through a fourteenth via, and the other end of the third transfer electrode is connected to the second electrode of the driving transistor through a fifteenth via.

10. The pixel driving circuit according to claim 8, wherein the first plate is on a side of the second plate away from a base substrate, the pixel driving circuit further comprises a fourth transfer electrode, one end of the fourth transfer electrode is connected to the second plate through a sixteenth via, and the other end of the fourth transfer electrode is connected to a second electrode of the third reset transistor through a seventeenth via, wherein the first energy storage element comprises a first capacitor, wherein the first capacitor comprises a first plate and a second plate, and the third plate of the second capacitor and the second plate are connected into a one-piece structure.

11. The pixel driving circuit according to claim 1, wherein the second energy storage element comprises a second capacitor, wherein the second capacitor comprises a third plate and a fourth plate, the third plate is connected to the first energy storage element, and the fourth plate is connected to the data writing sub-circuit, wherein the data writing sub-circuit comprises a data writing transistor; and the pixel driving circuit further comprises a fifth transfer electrode, wherein one end of the fifth transfer electrode is connected to a second electrode of the data writing transistor through an eighteenth via, and the other end of the fifth transfer electrode is connected to the fourth plate through a nineteenth via.

12. The pixel driving circuit according to claim 1, wherein the pixel driving circuit comprises a first gate metal layer, a semiconductor layer, and a second gate metal layer, which are sequentially arranged in a direction away from a base substrate, wherein respective transistors in the pixel driving circuit are all double-gate transistors, and the semiconductor layer comprises active layers, first electrodes and second electrodes of the respective transistors in the pixel driving circuit; the first gate metal layer comprises first gates of the respective transistors in the pixel driving circuit, and the second gate metal layer comprises second gates of the respective transistors in the pixel driving circuit.

13. The pixel driving circuit according to claim 12, wherein the light emitting control sub-circuit comprises a first light emitting control transistor and a second light emitting control transistor; and the pixel driving circuit further comprises a first source/drain metal layer on a side of the second gate metal layer away from the base substrate, wherein the first source/drain metal layer comprises a first transfer electrode, wherein the first transfer electrode is connected to the first electrode of the second light emitting control transistor through an eighth via, and is connected to the gate of the driving transistor through a ninth via, wherein the first electrode of the first light emitting control transistor is connected to a first power supply line, wherein the first power supply line comprises a first power supply sub-line and a second power supply sub-line, the first power supply sub-line is in the first source/drain metal layer, the second power supply sub-line is in a second source/drain metal layer, and the second source/drain metal layer is on a side of the first source/drain metal layer away from the base substrate; and the first power supply sub-line is connected to the first electrode of the first light emitting control transistor through a fourth via, and the second power supply sub-line is connected to the first power supply sub-line through a fifth via, wherein the first reset sub-circuit comprises a first reset transistor; the data writing sub-circuit comprises a data writing transistor;

orthographic projections of the active layer of the second reset transistor, the active layer of the third reset transistor, the active layer of the second light emitting control transistor, and the active layer of the data writing transistor on the base substrate each overlap an orthographic projection of the second power supply sub-line on the base substrate; and orthographic projections of the active layer of the first reset transistor, the active layer of the first light emitting control transistor, and the active layer of the driving transistor on the base substrate overlaps an orthographic projection of a second power supply line on the base substrate.

14. The pixel driving circuit according to claim 12, wherein the pixel driving circuit further comprises a light shielding metal layer between the first gate metal layer and the base substrate; and the first energy storage element comprises a first capacitor, and the first capacitor comprises a first plate and a second plate; the second energy storage element comprises a second capacitor, and the second capacitor comprises a third plate and a fourth plate; the light shielding metal layer comprises the second plate and the third plate; and the first gate metal layer further comprises the first plate and the fourth plate.

15. The pixel driving circuit according to claim 14, wherein the pixel driving circuit further comprises a first source/drain metal layer on a side of the second gate metal layer away from the base substrate; and the first source/drain metal layer comprises a third transfer electrode, wherein one end of the third transfer electrode is connected to the first gate of the driving transistor through a fourteenth via, and the other end of the third transfer electrode is connected to the second electrode of the driving transistor through a fifteenth via, wherein the first source/drain metal layer further comprises a fourth transfer electrode, wherein one end of the fourth transfer electrode is connected to the second plate through a sixteenth via, and the other end of the fourth transfer electrode is connected to the second electrode of the third reset transistor through a seventeenth via.

16. The pixel driving circuit according to claim 14, wherein the pixel driving circuit further comprises a first source/drain metal layer on a side of the second gate metal layer away from the base substrate; and the data writing sub-circuit comprises a data writing transistor; the first source/drain metal layer comprises a fifth transfer electrode, wherein one end of the fifth transfer electrode is connected to the second electrode of the data writing transistor through an eighteenth via, and the other end of the fifth transfer electrode is connected to the fourth plate through a nineteenth via.

17. A method of driving the pixel driving circuit according to claim 1, comprising:

in a reset phase, writing the initialization voltage signal to the third node through the first reset sub-circuit, turning it conductive between the gate of the driving transistor and the fourth node through the second reset sub-circuit, and resetting the gate of the driving transistor and the fourth node, wherein the first reset signal and the second reset signal are each in an operating level state;

in a threshold compensation phase, turning it conductive between the gate of the driving transistor and the fourth node through the second reset sub-circuit, to write a threshold voltage of the driving transistor to the first energy storage element, wherein the first light emitting control signal and the second reset signal are each in the operating level state;

in a data writing phase, writing the data voltage signal into the second energy storage element through the data writing sub-circuit, and resetting the fourth node through the second reset sub-circuit, wherein the second reset signal and the scanning signal are each in the operating level state; and in a light emitting phase, turning it conductive between the first electrode of the driving transistor and the power supply terminal and transmitting the data voltage signal to the gate of the driving transistor, through the light emitting control sub-circuit, so that the driving transistor provides a driving current for a light emitting device, wherein the first light emitting control signal and the second light emitting control signal are each in the operating level state.

18. A display substrate, comprising a display region, wherein the display region comprises a plurality of pixel regions, and each of the plurality of pixel regions is provided with the pixel driving circuit according to claim 1, and a light emitting device electrically connected to the pixel driving circuit.

* * * * *